United States Patent
Yin et al.

(10) Patent No.: US 12,411,186 B1
(45) Date of Patent: Sep. 9, 2025

(54) DETECTION METHOD FOR INVERTER SYSTEM, INVERTER SYSTEM, AND ARC DETECTION SYSTEM

(71) Applicant: Shanghai Sigeyuan Intelligent Technology Co., Ltd., Shanghai (CN)

(72) Inventors: Zhanxiang Yin, Shanghai (CN); Pengfei He, Shanghai (CN); Hao Chang, Shanghai (CN)

(73) Assignee: SHANGHAI SIGEYUAN INTELLIGENT TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 19/237,049

(22) Filed: Jun. 13, 2025

(30) Foreign Application Priority Data

Sep. 20, 2024 (CN) .......... 202411316815.0

(51) Int. Cl.
*G01R 31/40* (2020.01)
*G01R 19/165* (2006.01)

(52) U.S. Cl.
CPC ....... *G01R 31/40* (2013.01); *G01R 19/16528* (2013.01)

(58) Field of Classification Search
None
See application file for complete search history.

(56) References Cited

FOREIGN PATENT DOCUMENTS

| CN | 105703688 A | 6/2016 |
| JP | 2020141553 A | 9/2020 |
| KR | 101446669 B1 | 10/2014 |
| WO | 2024160036 A1 | 8/2024 |

OTHER PUBLICATIONS

First Office Action from corresponding Chinese Application No. 202411316815.0, dated Nov. 7, 2024. English translation attached.
Second Office Action from corresponding Chinese Application No. 202411316815.0, dated Jan. 10, 2025. English translation attached.
The Grant Notice from corresponding Chinese Application No. 202411316815.0, dated Feb. 7, 2025. English translation attached.
Ren, Renliang et al. "A study on measuring Invertor's output Waveform total Distortion by microprocessor", Chinese Journal of Scientific Instrument, Issue 2, Apr. 20, 2000 (Apr. 20, 2000), 80-82.

*Primary Examiner* — Lisa M Caputo
*Assistant Examiner* — Sharah Zaab

(57) ABSTRACT

Provided are a detection method for an inverter system, an inverter system, and an arc detection system, which belongs to the field of inverter systems. The detection method for an inverter system includes: obtaining a first actual value of a sampled signal obtained through sampling for the inverter system by an arc detection system, where the sampled signal is an input electrical signal or an inductive electrical signal of the inverter system; determining a saturation state of the sampled signal based on at least one of the first actual value, a maximum amplitude corresponding to the sampled signal, and a minimum amplitude corresponding to the sampled signal, where the saturation state includes saturated or unsaturated; and performing arc detection based on the saturation state.

19 Claims, 9 Drawing Sheets

Obtain a first actual value of a sampled signal obtained through sampling for the inverter system by the arc detection system, where the sampled signal is an input electrical signal or an inductive electrical signal of the inverter system — 110

Determine a saturation state of the sampled signal based on at least one of the first actual value, a maximum amplitude corresponding to the sampled signal, and a minimum amplitude corresponding to the sampled signal, where the saturation state includes saturated or unsaturated — 120

Perform arc detection based on the saturation state — 130

```
┌─────────────────────────────────────────────────────────────┐
│ Obtain a first actual value of a sampled signal obtained through sampling │
│   for the inverter system by the arc detection system, where the sampled  │ ∽ 110
│  signal is an input electrical signal or an inductive electrical signal of the │
│                        inverter system                      │
└─────────────────────────────────────────────────────────────┘
                              │
┌─────────────────────────────────────────────────────────────┐
│ Determine a saturation state of the sampled signal based on at least one of │
│ the first actual value, a maximum amplitude corresponding to the sampled │ ∽ 120
│  signal, and a minimum amplitude corresponding to the sampled signal,  │
│        where the saturation state includes saturated or unsaturated        │
└─────────────────────────────────────────────────────────────┘
                              │
┌─────────────────────────────────────────────────────────────┐
│         Perform arc detection based on the saturation state         │ ∽ 130
└─────────────────────────────────────────────────────────────┘
```

FIG. 1

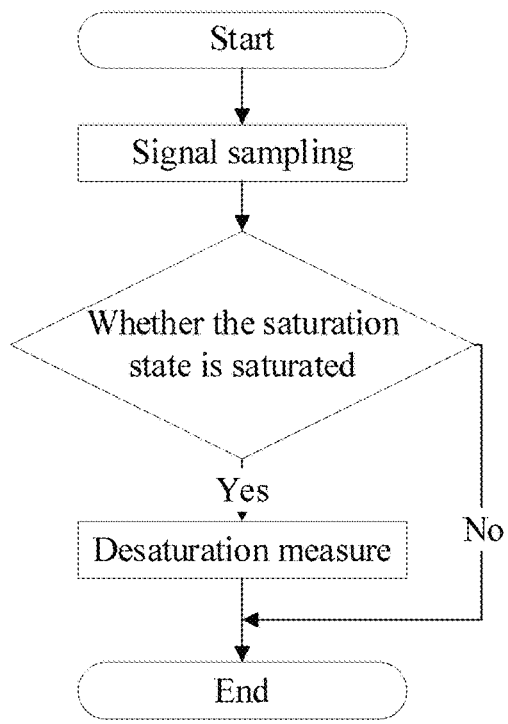

FIG. 2

DETECTION METHOD FOR INVERTER SYSTEM, INVERTER SYSTEM, AND ARC DETECTION SYSTEM

CROSS-REFERENCE TO RELATED APPLICATIONS

This application claims priorities to Chinese Patent Application No. 202411316815.0 filed on Sep. 20, 2024, the entire disclosure of which are incorporated herein by reference.

FIELD

The present disclosure relates to the field of inverter systems, and in particular, to a detection method for an inverter system, an inverter system, and an arc detection system.

BACKGROUND

An inverter system determines whether an arc occurs on a direct-current side by sampling a current by using an arc detection system, and analyzing the sampled signal through software. In the related technology, the sampled signal is affected by a sampling amplitude limit, such that the original signal is limited within the amplitude limit. When the sampled signal exceeds the amplitude limit, the sampled signal is determined to be saturated. In this case, influenced by a current operation condition of the inverter system, the sampled signal may be determined to be saturated even when there is no arc, resulting in distortion of the sampled signal, and affecting accuracy and integrity of sampling analysis.

SUMMARY

The present disclosure aims to at least solve one of the technical problems in the related technology. To this end, the present disclosure provides a detection method for an inverter system, an inverter system, and an arc detection system, which effectively determines a saturation state of a sampled signal. In response to the sampled signal being saturated, a desaturation measure is performed to ensure that the sampled signal is not distorted, to improve accuracy of arc detection and ensure integrity of the arc detection.

In a first aspect, the present disclosure provides a detection method for an inverter system. The inverter system is connected to an arc detection system. The method includes: obtaining a first actual value of a sampled signal obtained through sampling for the inverter system by the arc detection system, where the sampled signal is an input electrical signal or an inductive electrical signal of the inverter system; determining a saturation state of the sampled signal based on at least one of the first actual value, a maximum amplitude corresponding to the sampled signal, and a minimum amplitude corresponding to the sampled signal, where the saturation state includes saturated or unsaturated; and performing arc detection based on the saturation state.

With the detection method for an inverter system according to the present disclosure, the sampled signal is obtained by sampling the inverter system, and saturation detection is performed on the sampled signal to determine the saturation state of the sampled signal, to perform the arc detection based on an actual situation of the sampled signal, such that the saturation state of the sampled signal is effectively determined. In response to the sampled signal being saturated, the desaturation measure is performed to ensure that the sampled signal is not distorted, to improve the accuracy of the arc detection and ensure the integrity of the arc detection.

In the detection method for an inverter system according the present disclosure, the determining the saturation state of the sampled signal based on at least one of the first actual value, the maximum amplitude corresponding to the sampled signal, and the minimum amplitude corresponding to the sampled signal includes: obtaining a target saturation degree of the sampled signal based on the at least one of the first actual value, the maximum amplitude, and the minimum amplitude; obtaining a target threshold based on the maximum amplitude, the minimum amplitude, and sensitivity information, where the sensitivity information is determined based on an association relationship between the target saturation degree and an accuracy degree of an arc detection result of the inverter system; and determining the saturation state of the sampled signal based on at least two of the target saturation degree, the first actual value, and the target threshold.

In the detection method for an inverter system according to the present disclosure, the obtaining the target threshold based on the maximum amplitude, the minimum amplitude, and the sensitivity information includes: determining a first threshold based on the sensitivity information, the maximum amplitude, and the minimum amplitude, where the first threshold is smaller than or equal to a first ratio determined based on the maximum amplitude and a first difference, and the first difference is determined based on the maximum amplitude and the minimum amplitude; determining a second threshold based on a target value, the sensitivity information, the maximum amplitude, and the minimum amplitude, where the second threshold is greater than or equal to a second ratio determined based on the minimum amplitude and the first difference, and the second threshold is smaller than the first threshold; and determining the target threshold based on the first threshold and the second threshold.

In the detection method for an inverter system according to the present disclosure, the obtaining the target saturation degree of the sampled signal based on at least one of the first actual value, the maximum amplitude, and the minimum amplitude includes: obtaining the target saturation degree based on the first actual value, the maximum amplitude, and the minimum amplitude.

In the detection method for an inverter system according to the present disclosure, the determining the saturation state of the sampled signal based on the at least two of the target saturation degree, the first actual value, and the target threshold includes: determining that the sampled signal is saturated in response to the target saturation degree being greater than or equal to the first threshold or the target saturation degree being smaller than or equal to the second threshold; and determining that the sampled signal is unsaturated in response to the target saturation degree being greater than the second threshold and the target saturation degree being smaller than the first threshold.

In the detection method for an inverter system according to the present disclosure, the determining the saturation state of the sampled signal based on at least two of the target saturation degree, the first actual value, and the target threshold includes: determining that the sampled signal is saturated in response to the first actual value being greater than or equal to the first threshold or the first actual value being smaller than or equal to the second threshold; and determining that the sampled signal is unsaturated in response to the first actual value being greater than the second threshold and the first actual value being smaller than the first threshold.

In the detection method for an inverter system according to the present disclosure, the obtaining the target saturation degree of the sampled signal based on the at least one of the first actual value, the maximum amplitude, and the minimum amplitude includes: obtaining a maximum value and a minimum value of first actual values of a plurality of sampled signals within a target period; and obtaining the target saturation degree based on the maximum value and the minimum value.

In the detection method for an inverter system according to the present disclosure, the determining the saturation state of the sampled signal based on the target saturation degree and the target threshold includes: determining that the sampled signal is saturated in response to the target saturation degree being greater than or equal to the target threshold; and determining that the sampled signal is unsaturated in response to the target saturation degree being smaller than the target threshold.

In the detection method for an inverter system according to the present disclosure, the obtaining the target saturation degree of the sampled signal based on at least one of the first actual value, the maximum amplitude, and the minimum amplitude includes: obtaining a first sub-target saturation degree based on the first actual value and the maximum amplitude; obtaining a second sub-target saturation degree based on the first actual value and the minimum amplitude; and obtaining the target saturation degree based on the first sub-target saturation degree and the second sub-target saturation degree.

In the detection method for an inverter system according to the present disclosure, the determining the saturation state of the sampled signal based on the target saturation degree and the target threshold includes: determining that the sampled signal is saturated in response to the first sub-target saturation degree being smaller than or equal to the target threshold or the second sub-target saturation degree being smaller than or equal to the target threshold; and determining that the sampled signal is unsaturated in response to the first sub-target saturation degree being greater than the target threshold and the second sub-target saturation degree being greater than the target threshold.

In the detection method for an inverter system according to the present disclosure, in response to the sampled signal being the inductive electrical signal, the determining the saturation state of the sampled signal based on at least one of the first actual value, the maximum amplitude corresponding to the sampled signal, and the minimum amplitude corresponding to the sampled signal includes: determining a saturation state of the inductive electrical signal based on the first actual value of the inductive electrical signal, the input voltage of the inverter system, and the switching frequency of the switching tube in the inverter system.

In the detection method for an inverter system according to the present disclosure, the determining the saturation state of the inductive electrical signal based on the first actual value of the inductive electrical signal, the input voltage of the inverter system, and the switching frequency of the switching tube in the inverter system includes: obtaining a target current ripple based on at least one of the first actual value of the inductive electrical signal, the input voltage of the inverter system, and the switching frequency of the switching tube in the inverter system; obtaining a target ripple threshold based on the inductive electrical signal and inductive current sensitivity information, where the inductive current sensitivity information is determined based on a ratio of a maximum value corresponding to a current ripple range of the inductive electrical signal to the first actual value of the inductive electrical signal; and determining the saturation state of the inductive electrical signal based on the target current ripple and the target ripple threshold.

In the detection method for an inverter system according to the present disclosure, the obtaining the target current ripple based on at least one of the first actual value of the inductive electrical signal, the input voltage of the inverter system, and the switching frequency of the switching tube in the inverter system includes: obtaining a maximum inductive current value and a minimum inductive current value of first actual values of a plurality of inductive electrical signals within a target period; and obtaining the target current ripple based on the maximum inductive current value and the minimum inductive current value.

In the detection method for an inverter system according to the present disclosure, the obtaining the target current ripple based on at least one of the first actual value of the inductive electrical signal, the input voltage of the inverter system, and the switching frequency of the switching tube in the inverter system includes: obtaining the target current ripple based on the first actual value of the inductive electrical signal, the input voltage of the inverter system, and the switching frequency of the switching tube in the inverter system.

In the detection method for an inverter system according to the present disclosure, the determining the saturation state of the inductive electrical signal based on the target current ripple and the target ripple threshold includes: determining that the inductive electrical signal is saturated in response to the target current ripple being greater than or equal to the target ripple threshold; and determining that the inductive electrical signal is unsaturated in response to the target current ripple being smaller than the target ripple threshold.

In the detection method for an inverter system according to the present disclosure, the determining the saturation state of the sampled signal based on at least one of the first actual value, the maximum amplitude corresponding to the sampled signal, and the minimum amplitude corresponding to the sampled signal includes: performing transformation on the first actual value to obtain target transformation data; performing algorithm analysis on the target transformation data to obtain an algorithm analysis result; and determining the saturation state of the sampled signal based on the algorithm analysis result.

In the detection method for an inverter system according to the present disclosure, the performing the algorithm analysis on the target transformation data to obtain the algorithm analysis result includes: grouping the target transformation data to obtain at least one target data group; calculating statistical information corresponding to each of the at least one target data group; determining weight information of each of the at least one target data group based on the statistical information; and performing the algorithm analysis based on the weight information and each of the at least one target data group to obtain an algorithm analysis result.

In the detection method for an inverter system according to the present disclosure, the determining the saturation state of the sampled signal based on the algorithm analysis result includes: determining a spectral characteristic based on the algorithm analysis result; and determining the saturation state of the sampled signal based on the spectral characteristic.

In the detection method for an inverter system according to the present disclosure, the determining the saturation state of the sampled signal based on the spectral characteristic includes: determining an arc state based on the spectral characteristic, where the arc state includes arc generation or no arc generation; and determining the saturation state of the sampled signal based on the arc state.

In the detection method for an inverter system according to the present disclosure, the performing the arc detection based on the saturation state includes: performing the desaturation processing on the sampled signal in response to the saturation state being saturated to obtain an unsaturated sampled signal; and performing the arc detection based on the unsaturated sampled signal.

In the detection method for an inverter system according to the present disclosure, the performing the desaturation processing on the sampled signal to obtain the unsaturated sampled signal includes: performing the desaturation processing on the sampled signal by adjusting at least one of the input voltage of the inverter system, the input current of the inverter system, the bus voltage of the inverter system, and the switching frequency of the switching tube in the inverter system to obtain the unsaturated sampled signal.

In the detection method for an inverter system according to the present disclosure, the performing the desaturation processing on the sampled signal by adjusting the bus voltage of the inverter system to obtain the unsaturated sampled signal includes: adjusting at least one of a bus voltage corresponding to the inverter system, a bus voltage corresponding to a battery pack electrically connected to an inverter, and a bus voltage corresponding to a charging pile electrically connected to the inverter, to perform the desaturation processing on the sampled signal to obtain the unsaturated sampled signal.

In a second aspect, the present disclosure provides a detection device for an inverter system. The inverter system is connected to an arc detection system. The device includes: a first processing module configured to obtain a first actual value of a sampled signal obtained through sampling for the inverter system by the arc detection system, where the sampled signal is an input electrical signal or an inductive electrical signal of the inverter system; a second processing module configured to determine a saturation state of the sampled signal based on at least one of the first actual value, a maximum amplitude corresponding to the sampled signal, and a minimum amplitude corresponding to the sampled signal, where the saturation state includes saturated or unsaturated; a third processing module configured to perform arc detection based on the saturation state.

With the detection device for an inverter system according to the present disclosure, the sampled signal is obtained by sampling the inverter system, and the saturation detection is performed on the sampled signal to determine the saturation state of the sampled signal, to perform the arc detection based on the actual situation of the sampled signal, such that the saturation state of the sampled signal can be effectively determined. In response to the sampled signal being saturated, the desaturation measure is performed to ensure that the sampled signal is not distorted, to improve the accuracy of the arc detection and ensure the integrity of the arc detection.

In a third aspect, the present disclosure provides an inverter system. The inverter system performs detection based on the detection method for an inverter system as described in the first aspect.

In a fourth aspect, the present disclosure provides an arc detection system based on the detection method for an inverter system as described in the first aspect. The arc detection system includes: a sampling module; and a signal processing module. The signal processing module is electrically connected to the signal processing module.

In a fifth aspect, the present disclosure provides a non-transitory computer-readable storage medium, having a computer program stored thereon. The computer program, when executed by a processor, implements the detection method for an inverter system as described in the above first aspect.

In a sixth aspect, the present disclosure provides a computer program product including a computer program. The computer program, when executed by a processor, implements the detection method for an inverter system as described in the above first aspect.

One or more of the above technical solutions in embodiments of the present disclosure have at least one of the following technical effects.

The sampled signal is obtained by sampling the inverter system, and the saturation detection is performed on the sampled signal to determine the saturation state of the sampled signal, to perform the arc detection based on the actual situation of the sampled signal, such that the saturation state of the sampled signal can be effectively determined. In response to the sampled signal being saturated, the desaturation measure is performed to ensure that the sampled signal is not distorted, to improve the accuracy of the arc detection and ensure the integrity of the arc detection.

Further, each of the target saturation degree and the target threshold of the sampled signal is determined based on one or more of the first actual value, the maximum amplitude, the minimum amplitude, and the sensitivity information of the sampled signal, to effectively determine the saturation state of the sampled signal based on the target saturation degree and an association relationship between the first actual value and the target threshold. The determination method is simple and convenient, and has high operability.

Further, the current ripple of the inductive electrical signal is calculated based on the collected inductive electrical signal, the input voltage of the inverter system, and the switching frequency of the switching tube in the inverter system, to determine the saturation degree of the sampled signal based on the current ripple of the inductive electrical signal, and effectively determine the saturation state of the sampled signal. The determination method is simple and convenient.

Further, by adjusting the bus voltage corresponding to the photovoltaic inverter in the inverter system, the bus voltage corresponding to the battery pack used in conjunction with the photovoltaic inverter, and the bus voltage corresponding to the charging pile, or in other various manners, the bus voltage of the inverter system is effectively adjusted. An available adjustment method is flexibly selected to desaturate the saturated sampled signal to obtain the unsaturated sampled signal, to cope with a problem that the sampled signal may be distorted when being saturated, which affects the analysis accuracy of the sampled signal, so as to improve the accuracy of the arc detection.

Additional aspects and advantages of the present disclosure will be provided in part in the following description, or will become apparent in part from the following description, or can be learned from practicing of the present disclosure.

BRIEF DESCRIPTION OF THE DRAWINGS

The above and/or additional aspects and advantages of the present disclosure will become more apparent and more understandable from the following description of embodiments taken in conjunction with the accompanying drawings, in which:

FIG. 1 is a schematic flowchart of a detection method for an inverter system according to an embodiment of the present disclosure;

FIG. 2 is a schematic flowchart of a detection method for an inverter system according to an embodiment of the present disclosure;

DETAILED DESCRIPTION

Figure 3:
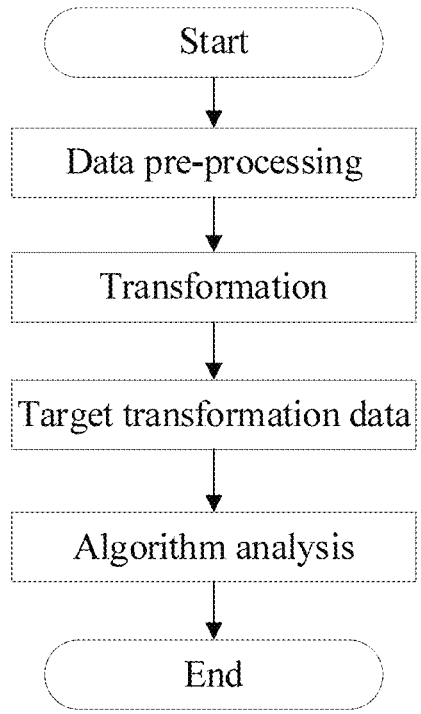
FIG. 3 is a schematic flowchart of a detection method for an inverter system according to an embodiment of the present disclosure.

Technical solutions according to embodiments of the present disclosure will be described clearly below in conjunction with accompanying drawings of the embodiments of the present disclosure. Obviously, the embodiments described below are a part of the embodiments of the present disclosure, rather than all embodiments of the present disclosure. On a basis of the embodiments of the present disclosure, all other embodiments obtained by those skilled in the art shall fall within the scope of the present disclosure.

Terms such as "first" and "second" in the specification and claims of the present disclosure are used only to distinguish between similar objects, rather than to describe a particular order or sequence. It should be understood that the data as used can be interchanged where appropriate, to enable the embodiments of the present disclosure described herein to be implemented in an order other than that illustrated or described herein. Also, the objects distinguished by the terms such as "first" and "second" are usually objects of the same type. The quantity of objects is not limited. For example, a first object may be one first object or a plurality of first objects. In addition, "and/or" throughout the specification and claims indicates at least one of the objects associated with "and/or". The character "/" generally indicates that the associated objects before and after the character are in an "or" relationship.

A detection method for an inverter system, a detection device for an inverter system, an inverter system, and a readable storage medium according to the embodiments of the present disclosure will be described in detail below in detail with reference to specific embodiments and application scenarios thereof in conjunction with the accompanying drawings.

The detection method for an inverter system may be applied to a terminal and may be executed by hardware or software in the terminal.

This terminal includes, but is not limited to, portable communication devices such as a mobile phone or a tablet computer. It should also be understood that in some embodiments, the terminal may not be the portable communication device, but a desktop computer.

In the following various embodiments, a terminal including a display and a touch-sensitive surface is described. However, it should be understood that the terminal may include one or more other physical user interface devices such as a physical keyboard, a mouse, and a control stick.

For the detection method for an inverter system according to the embodiments of the present disclosure, an execution subject of the detection method for an inverter system may be the inverter system, or an electronic device in a communication connection with the inverter system, or a functional module or a functional entity in the electronic device capable of implementing the detection method for an inverter system. The electronic device mentioned in the embodiments of the present disclosure includes, but is not limited to, a mobile phone, a tablet computer, a computer, a camera, and a wearable device. The detection method for an inverter system according to the embodiments of the present disclosure will be described below by taking the electronic device serving as the execution subject as an example.

As shown in FIG. 1, the detection method for an inverter system includes: step 110, step 120, and step 130.

The inverter system is connected to an arc detection system.

The arc detection system is configured to sample a current of the inverter system to determine whether an arc occurs.

At step 110, a first actual value of a sampled signal obtained through sampling for the inverter system by the arc detection system is obtained.

In this step, the sampled signal is an input electrical signal of the inverter system or an inductive electrical signal of the inverter system.

The input electrical signal is a signal of the inverter system obtained by sampling the inverter system, and may be represented as S.

The input electrical signal may be an input current.

The inductive electrical signal is the signal of the inverter system obtained by sampling the inverter system, and may be represented as $I_L$.

The inductive electrical signal may be an inductive current.

The sampled signal is obtained through the sampling for the inverter system by the arc detection system.

The first actual value is an actual value corresponding to the sampled signal.

During an actual implementation, the input electrical signal or the inductive electrical signal may be obtained through the sampling for the inverter system by the arc detection system.

At block 120, a saturation state of the sampled signal is determined based on at least one of the first actual value, a maximum amplitude of the sampled signal, and a minimum amplitude of the sampled signal.

In this step, the maximum amplitude is an upper amplitude limit for determining whether the sampled signal is saturated.

The minimum amplitude is a lower amplitude limit for determining whether the sampled signal is saturated.

The maximum amplitude and the minimum amplitude are amplitude limits of the sampled signal.

The saturation state is a saturation situation of the sampled signal.

The saturation state includes: saturated or unsaturated.

During an actual implementation, a sampling range of a sampling circuit of the arc detection system is mapped to corresponding software to obtain an amplitude limiting range for software sampling.

The maximum amplitude of the sampled signal and the minimum amplitude of the sampled signal may be obtained by software based on an analogue-to-digital (AD) sampling specification of a sampling chip.

In some embodiments, in response to the sampled signal exceeding the sampling range of the sampling circuit or the sampled signal exceeding the amplitude limit of the sampled signal, i.e., when the sampled signal is greater than the maximum amplitude or smaller than the minimum amplitude, it is determined that the sampled signal is saturated.

In some embodiments, in response to the sampled signal being smaller than or equal to the maximum amplitude and being greater than or equal to the minimum amplitude, it is determined that the sampled signal is unsaturated.

At step 130, arc detection is performed based on the saturation state.

In this step, after the saturation state of the sampled signal is determined, the arc detection may be performed based on the actual saturation state to determine whether an arc occurs.

In some embodiments, in response to the sampled signal being unsaturated, the sampled signal may be further analyzed to determine whether an arc occurs.

In other embodiments, when the sampled signal is saturated, analysis performed based on the saturated sampled signal has poor accuracy. At this time, the sampled signal may be processed. Based on the processed sampled signal, the analysis may be performed to determine whether an arc occurs.

As shown in FIG. 2, after the sampled signal is obtained, the saturation state of the sampled signal is detected. In response to the sampled signal being unsaturated, the sampled signal is used for subsequent arc detection.

With the detection method for an inverter system according to the embodiments of the present disclosure, the sampled signal is obtained by sampling the inverter system, and the saturation detection is performed on the sampled signal to determine the saturation state of the sampled signal, and the arc detection is performed based on the actual situation of the sampled signal, which effectively determines the saturation state of the sampled signal. In response to the sampled signal being saturated, desaturation is performed to ensure that the sampled signal is not distorted, to improve accuracy of the arc detection and ensure integrity of the arc detection.

In some embodiments, step 130 may further include: performing, in response to the saturation state being saturated, desaturation processing on the sampled signal to obtain an unsaturated sampled signal; and performing the arc detection based on the unsaturated sampled signal.

In this embodiment, the desaturation processing is an operation of processing the saturated sampled signal to obtain the unsaturated sampled signal.

It should be understood that, due to amplitude limiting occurred when sampling, the original signal is limited within the amplitude limit. In response to the sampled signal exceeding the amplitude limit, it is determined that the saturation state of the sampled signal is saturated. The sampled signal is affected by an operation condition of the inverter system, and may reach saturation when no arc occurs, and the desaturation may be performed for the sampled signal.

The saturation of the sampled signal will lead to signal distortion, affecting an accuracy of software analysis. At this time, the desaturation processing may be performed on the saturated sampled signal to obtain the unsaturated sampled signal, to ensure that the sampled signal is not distorted, which ensures the accuracy of the arc detection.

During an actual implementation, there is a resonance point between capacitive reactance and inductive reactance of each of a photovoltaic cell panel and a photovoltaic inverter in the inverter system. An input voltage and the input current follow a current-voltage curve of the photovoltaic cell panel. When the input voltage and the input current approach the resonance point, an input current ripple is increased, resulting in an increase in the sampled signal, and the sampled signal reaches the maximum amplitude at the resonance point. At this time, it is necessary to change the current operation condition to avoid the resonance point, to perform the desaturation processing on the sampled signal.

Continuing to refer to FIG. 2, in response to determining that the sampled signal is saturated by performing the saturation detection on the sampled signal, the sampled signal may be desaturated through the desaturation measure to obtain the unsaturated sampled signal, and the unsaturated sampled signal may be used for the subsequent arc detection.

With the detection method for an inverter system according to the embodiments of the present disclosure, in response to determining that the sampled signal is saturated, the desaturation processing is performed on the sampled signal to obtain the unsaturated sampled signal. In this way, the arc detection is performed based on the unsaturated sampled signal, which ensures completeness of the analysis for the sampled signal and improves accuracy of the arc detection.

In some embodiments, performing the desaturation processing on the sampled signal to obtain the unsaturated sampled signal may further include: performing the desaturation processing on the sampled signal by adjusting at least one of an input voltage of the inverter system, an input current of the inverter system, a bus voltage of the inverter system, and a switching frequency of a switching tube in the inverter system, to obtain the unsaturated sampled signal.

In this embodiment, during an actual implementation, an operation characteristic of the photovoltaic cell panel in the inverter system during operation may be represented as the current-voltage curve, which varies correspondingly under different light intensities and temperatures.

When the input voltage or the input current changes according to the curve, the change of the input voltage causes the change of the input current, and the change of the input current causes the change of the input voltage.

During an actual implementation, changing the operation condition of the inverter system may cause the input voltage and the input current to avoid the resonance point of the hardware circuit, i.e., to reduce a degree of the sampling signal approaching saturation.

In some embodiments, the input voltage of the inverter system may be increased or decreased (for example, by adjusting an output voltage of the photovoltaic cell panel), so that the input voltage is changed by ΔV until the sampled signal is desaturated to obtain the unsaturated sampled signal.

In some embodiments, the input current of the inverter system may be increased or decreased (for example, by adjusting an output current of the photovoltaic cell panel), so that the input current is changed by A/until the sampled signal is desaturated to obtain the unsaturated sampled signal.

In some embodiments, input power of the inverter system may be increased or decreased (for example, by adjusting output power of the photovoltaic cell panel), so that the input current and the input voltage are changed until the sampled signal is desaturated to obtain the unsaturated sampled signal.

In some embodiments, a rated input current of the inverter system may be reduced, to limit an upper limit of the input current, so that the input current is changed by A/until the sampled signal is desaturated to obtain the unsaturated sampled signal.

In some embodiments, rated input power of the inverter system may be reduced, to change the input voltage and the input current until the sampled signal is desaturated to obtain the unsaturated sampled signal.

The sampled signal may also be desaturated by adjusting the bus voltage of the inverter system.

In some embodiments, performing the desaturation processing on the sampled signal by adjusting the bus voltage of the inverter system to obtain the unsaturated sampled signal may further include: adjusting at least one of a bus voltage corresponding to the inverter system, a bus voltage corresponding to a battery pack electrically connected to an inverter, and a bus voltage corresponding to a charging pile electrically connected to the inverter, to perform the desaturation processing on the sampled signal to obtain the unsaturated sampled signal.

In this embodiment, the inverter system may be a photovoltaic inverter.

It should be understood that the inverter system has a variety of applicable scenarios. In different scenarios, the bus voltage of the inverter system may also be changed by other devices, except for by adjusting a bus voltage of the photovoltaic inverter.

During an actual implementation, the photovoltaic inverter may be used in conjunction with the battery pack and the charging pile, and the bus voltage of the inverter system may be changed by controlling one or more of the battery pack and the charging pile.

During an actual implementation, bus voltage adjustment is applicable to alternating-current voltage adjustment and direct-current voltage adjustment.

The charging pile may include: a direct-current charging pile and an alternating-current charging pile.

In some embodiments, the bus voltage may be changed by ΔV by adjusting the at least one of the bus voltage corresponding to the photovoltaic inverter, the bus voltage corresponding to the battery pack, and the bus voltage corresponding to the charging pile in the inverter system, until the sampled signal is desaturated, to obtain the unsaturated sampled signal.

In some embodiments, the bus voltage of the inverter system may be changed by increasing or reducing output power of the photovoltaic inverter in the inverter system to perform the desaturation processing on the sampled signal, to obtain the unsaturated sampled signal.

In this embodiment, in response to the output power of the photovoltaic inverter in the inverter system being increased, the demand for electrical energy by a load on a bus increases, thereby increasing the bus voltage until the sampled signal is desaturated, to obtain the unsaturated sampled signal.

In response to the output power of the photovoltaic inverter in the inverter system being reduced, the demand for the electrical energy by the load on the bus is lowered, thereby reducing the bus voltage until the sampled signal is desaturated, to obtain the unsaturated sampled signal.

In other embodiments, the bus voltage of the inverter system may be lowered by lowering an upper limit of the bus voltage of the inverter system, until the sampled signal is desaturated to obtain the unsaturated sampled signal.

The inventor found in a research and development process that, in response to the sampled signal being saturated, distortion of the sampled signal is caused, which affects accuracy of the analysis for the sampled signal. In the related technology, a saturated frequency band is avoided by lowering an overall sampling gain or a gain of a predetermined frequency band and by shortening a sampling passband. However, the above method has poor recognition performance on a small signal, which lowers completeness of sampling analysis.

In the present disclosure, by adjusting the input voltage of the inverter system, the input current of the inverter system, the bus voltage of the inverter system, and the switching frequency of the switching tube in the inverter system, or in other manners, the desaturation processing is performed on the sampled signal to obtain the unsaturated sampled signal, which ensures the recognition performance for the small signal and ensures integrity of the sampling analysis, thereby improving the accuracy of the arc detection.

With the detection method for an inverter system according to the embodiments of the present disclosure, by adjusting the bus voltage corresponding to the photovoltaic inverter in the inverter system, as well as the bus voltage corresponding to the battery pack used in conjunction with the photovoltaic inverter, and the bus voltage corresponding to the charging pile, or in other various manners, the bus voltage of the inverter system is effectively adjusted. An available adjustment method is flexibly selected to desaturate the saturated sampled signal to obtain the unsaturated sampled signal, to cope with a problem that the sampled signal may be distorted when being saturated, which affects the accuracy of analysis of the sampled signal, so as to improve the accuracy of the arc detection.

During an actual implementation, in response to the photovoltaic inverter operating to the resonance point, a resonance frequency between the capacitive reactance and the inductive reactance of each of the photovoltaic cell panel and the photovoltaic inverter is the same as or close to the switching frequency of the switching tube. At this time, by adjusting the switching frequency of the switching tube, it is possible to increase the difference between the switching frequency and the resonance point to avoid the resonance point, until the sampled signal is desaturated.

It should be understood that a change in the switching frequency of the switching tube is limited within a hardware stress tolerance range of the switching tube.

The switching tube may be a switching tube that converts a direct current to another direct current.

With the detection method for an inverter system according to the embodiments of the present disclosure, the saturated sampled signal is desaturated by adjusting the input voltage of the inverter system, the input current of the inverter system, the bus voltage of the inverter system, and the switching frequency of the switching tube or in other various manners. A desaturation manner may be flexibly selected by a user based on actual use scenarios to obtain the desaturated sampled signal, improving user experience.

During an actual implementation, the saturation state of the sampled signal may be determined in various manners.

Various manners for determining the saturation state of the sampled signal are described below.

In a first manner, the saturation state is determined through Analog-to-digital sampling analysis.

In some embodiments, step 120 may further include: obtaining a target saturation degree of the sampled signal based on at least one of the first actual value, the maximum amplitude, and the minimum amplitude; obtaining a target threshold based on the maximum amplitude, the minimum amplitude, and sensitivity information; and determining the saturation state of the sampled signal based on at least two of the target saturation degree, the first actual value, and the target threshold.

In this embodiment, the target saturation degree is a near-saturation degree of the sampled signal determined based on an association relationship between the first actual value and the maximum amplitude and an association relationship between the first actual value and the minimum amplitude, and may be represented as E.

The target saturation degree is used for performing saturation state determination in a subsequent process.

The sensitivity information is determined based on an association relationship between the target saturation degree and an accuracy degree of an arc detection result of the inverter system, and may be represented as Se.

The sensitivity information may be used for characterizing a perception capability of the inverter system on the target saturation degree.

During an actual implementation, an influence of different target saturation degrees of the photovoltaic inverter on an arc detection determination result may be evaluated through experimental tests, thereby determining a value of the sensitivity information based on a degree of influence.

For example, in response to the target saturation degree of the sampled signal being relatively high (i.e., the sampled signal being relatively close to saturation), an accuracy of the arc detection determination result is A %, and a degree of influence of the target saturation degree on the accuracy of the arc detection determination result may be X. At this time, the sensitivity information may be determined as X.

In response to the target saturation degree of the sampled signal being relatively low, the accuracy of the arc detection determination result is B %, and the degree of influence of the target saturation degree on the accuracy of the arc detection determination result may be Y. At this time, the sensitivity information may be determined as Y.

During an actual implementation, an influence of different target saturation degrees on the arc detection determination result may be analyzed through a plurality of groups of experimental data, thereby determining the value of the sensitive information based on the degree of influence.

The target threshold is a set value for determining the saturation state of the sampled signal.

During an actual implementation, the first actual value may be processed by using the maximum amplitude and the minimum amplitude to obtain the target saturation degree of the sampled signal. Moreover, the target threshold for determining the saturation state of the sampled signal may be obtained based on the maximum amplitude, the minimum amplitude, and the sensitivity information. In this way, the saturation state of the sampled signal is determined based on the association relationship between the target saturation state and the target threshold or based on the association relationship between the first actual value and the target threshold.

With the detection method for an inverter system according to the embodiments of the present disclosure, the target saturation degree of the sampled signal and the target threshold are determined based on one or more of the first actual value, the maximum amplitude, the minimum amplitude, and the sensitivity information of the sampled signal, to effectively determine the saturation state of the sampled signal based on the target saturation degree and the association relationship between the first actual value and the target threshold. The determination manner is simple and convenient, and has strong operability.

During an actual implementation, different processing may be performed on the first actual value, the maximum amplitude, and the minimum amplitude to obtain different target saturation degrees and different target thresholds, thereby determining the saturation state of the sampled signal through determination methods corresponding to the different target saturation degrees and different target thresholds.

Manners of determining the saturation state by performing different processing on the first actual value, the maximum amplitude, and the minimum amplitude are described below.

(1) Determining the Saturation State by Processing the First Actual Value

In some embodiments, obtaining the target threshold based on the maximum amplitude, the minimum amplitude, and the sensitivity information may further include: determining a first threshold based on the sensitivity information, the maximum amplitude, and the minimum amplitude, where the first threshold is smaller than or equal to a first ratio determined based on the maximum amplitude and a first difference, and the first difference is determined based on the maximum amplitude and the minimum amplitude; determining a second threshold based on a target value, the sensitivity information, the maximum amplitude, and the minimum amplitude, where the second threshold is greater than or equal to a second ratio determined based on the minimum amplitude and the first difference, and the second threshold is smaller than the first threshold; and determining the target threshold based on the first threshold and the second threshold.

In this embodiment, the first threshold is a maximum reference value for determining the saturation state of the sampled signal.

The second threshold is a minimum reference value for determining the saturation state of the sampled signal.

The target value is a constant for determining the second threshold, and may be 1.

The first threshold may be determined according to the following equation:

$$S_{t1}=f_2(S_{imtdn},S_{imtup},S_e),$$

$S_{t1}$ being the first threshold, $S_{imtdn}$ being the minimum amplitude, $S_{imtup}$ being the maximum amplitude, $S_e$ being the sensitivity information, and $f_2$ being a second functional relationship.

The sensitivity information is a numerical value ranging from 0 to 1, and may also be represented as a numerical value ranging from 0% to 100%.

In an embodiment, the first threshold may be determined according to the following equation:

$$S_{t1}=S_e(S_{imtup}-S_{imtdn}),$$

$S_{t1}$ being the first threshold, $S_{imtdn}$ being the minimum amplitude, $S_{imtup}$ being the maximum amplitude, and $S_e$ being the sensitivity information.

The second threshold may be determined according to the following equation:

$$S_{t2}=f_3(S_{imtdn},S_{imtup},S_e)$$

$S_{t2}$ being the second threshold, $S_{imtdn}$ being the minimum amplitude, $S_{imtup}$ being the maximum amplitude, $S_e$ being the sensitivity information, and $f_3$ being a third functional relationship.

In an embodiment, the second threshold may be determined according to the following equation:

$$S_{t2}=(1-S_e)(S_{imtup}-S_{imtdn})$$

$S_{t2}$ being the second threshold, $S_{imtdn}$ being the minimum amplitude, $S_{imtup}$ being the maximum amplitude, and $S_e$ being the sensitivity information.

The first difference is determined according to the following equation:

$$A=S_{imtup}-S_{imtdn}$$

A being the first difference, $S_{imtdn}$ being the minimum amplitude, and $S_{imtup}$ being the maximum amplitude.

The first ratio is determined according to the following equation:

$$B=S_{imtup}/(S_{imtup}-S_{imtdn}),$$

B being the first ratio, $S_{imtdn}$ being the minimum amplitude, and $S_{imtup}$ being the maximum amplitude.

The second ratio is determined according to the following equation:

$$C=S_{imtdn}/(S_{imtup}-S_{imtdn}),$$

C being the second ratio, $S_{imtdn}$ being the minimum amplitude, and $S_{imtup}$ being the maximum amplitude.

An association relationship between the first threshold and the second threshold may be determined according to the following equation:

$$S_{imtdn}/(S_{imtup}-S_{imtdn}) \leq S_{t2} \leq S_{t1} \leq S_{imtup}/(S_{imtup}-S_{imtdn})$$

During an actual implementation, the first threshold may be determined based on the sensitivity information, the maximum amplitude, and the minimum amplitude. The second threshold may be determined based on the target value, the sensitivity information, the maximum amplitude, and the minimum amplitude. The first threshold and the second threshold may be jointly determined as the target threshold for determining the saturation state of the sampled signal.

With the detection method for an inverter system according to the embodiments of the present disclosure, through a plurality of values among the target value, the sensitive information, the maximum amplitude, and the minimum amplitude, the first threshold and the second threshold are determined by taking the amplitude limit of the sampled signal, as well as the perception ability of the sensitive information to the near-saturation degree of the sampled signal into consideration. The determined first threshold and the determined second threshold are jointly used for determining the saturation state of the sampled signal. The threshold determination manner is simple and convenient, and is scientific and rational, providing a reference value for subsequent determination of the saturation state of the sampled signal.

In some embodiments, obtaining the target saturation degree of the sampled signal based on at least one of the first actual value, the maximum amplitude, and the minimum amplitude may further include: obtaining the target saturation degree based on the first actual value, the maximum amplitude, and the minimum amplitude.

In this embodiment, the target saturation degree may be determined according to the following equation:

$$E=f_1(S,S_{imtdn},S_{imtup})$$

E being the target saturation degree, S being the first actual value, $S_{imtdn}$ being the minimum amplitude, $S_{imtup}$ being the maximum amplitude, and $f_1$ being a first functional relationship.

In an embodiment, the target saturation degree may be determined according to the following equation:

$$E=S/(S_{imtup}-S_{imtdn})$$

E being the target saturation degree, S being the first actual value, $S_{imtdn}$ being the minimum amplitude, $S_{imtup}$ being the maximum amplitude.

During an actual implementation, the first actual value may be processed by using the maximum amplitude and the minimum amplitude to obtain the target saturation degree, and the saturation state of the sampled signal may be determined based on the target saturation degree.

With the detection method for an inverter system according to the embodiments of the present disclosure, the near-saturation degree of the sampled signal, i.e., the target saturation degree, is obtained by processing the first actual value through the maximum amplitude and the minimum amplitude, thereby determining the saturation state of the sampled signal based on the target saturation degree. The processing manner is simple and convenient, which effectively improves determination efficiency.

In some embodiments, determining the saturation state of the sampled signal based on the at least two of the target saturation degree, the first actual value, and the target threshold may further include: determining that the sampled signal is saturated in response to the target saturation degree being greater than or equal to the first threshold or the target saturation degree being smaller than or equal to the second threshold; and determining that the sampled signal is unsaturated in response to the target saturation degree being greater than the second threshold and smaller than the first threshold.

In this embodiment, during an actual implementation, an association relationship between the target saturation degree and the target threshold may be analyzed to obtain a saturation determination result of the sampled signal to determine the saturation state of the sampled signal.

The saturation state may be determined according to the following equation:

$$T=f_4(E,S_{t1},S_{t2})$$

T being the saturation state, E being the target saturation degree, $S_{t1}$ being the first threshold, $S_{t2}$ being the second threshold, and $f_4$ being a fourth functional relationship.

In some embodiments, it is determined that the sampled signal is saturated in response to the target saturation degree being greater than or equal to the first threshold.

In some embodiments, it is determined that the sampled signal is saturated in response to the target saturation degree being smaller than or equal to the second threshold.

In other embodiments, in response to the target saturation degree being greater than the second threshold and smaller than the first threshold, it is determined that the sampled signal is unsaturated.

During an actual implementation, the saturation state of the sampled signal may be determined according to the following expression:

$$T = \begin{cases} \text{saturated}, & E \geq S_{t1} \text{ or } E \leq S_{t2} \\ \text{unsaturated}, & S_{t2} < E < S_{t1} \end{cases},$$

T being the saturation state, E being the target saturation degree, $S_{t1}$ being the first threshold, and $S_{t2}$ being the second threshold.

With the detection method for an inverter system according to the embodiments of the present disclosure, by comparing the target saturation degree obtained by processing the first actual value with the determined target threshold, the saturation state of the sampled signal is effectively determined. The determination logic is simple and convenient, easy to operate, which improves the determination efficiency of the saturation state of the sampled signal, and thus improves efficiency of the arc detection.

In some embodiments, determining the saturation state of the sampled signal based on at least two of the target saturation degree, the first actual value, and the target threshold may further include: determining that the sampled signal is saturated in response to the first actual value being greater than or equal to the first threshold or the first actual value being smaller than or equal to the second threshold; and determining that the sampled signal is unsaturated in response to the first actual value being greater than the second threshold and the first actual value being smaller than the first threshold.

In this embodiment, during an actual implementation, after the target threshold is obtained, the saturation determination result of the sampled signal may be obtained by obtaining the association relationship between the first actual value and the target threshold to determine the saturation state of the sampled signal.

In some embodiments, it is determined that the sampled signal is saturated in response to the first actual value of the sampled signal being greater than or equal to the first threshold.

In some embodiments, it is determined that the sampled signal is saturated in response to the first actual value of the sampled signal being smaller than or equal to the second threshold.

In other embodiments, it is determined that the sampled signal is unsaturated in response to the first actual value of the sampled signal being greater than the second threshold and smaller than the first threshold, i.e., it is determined that the sampled signal is unsaturated in response to the first actual value ranging from the first threshold to the second threshold.

During an actual implementation, the saturation state of the sampled signal may o be determined according to the following expression:

$$T = \begin{cases} \text{saturated}, & S \geq S_{t1} \text{ or } S \leq S_{t2} \\ \text{unsaturated}, & S_{t2} < S < S_{t1} \end{cases},$$

T being the saturation state, S being the first actual value, $S_{t1}$ being the first threshold, $S_{t2}$ being the second threshold.

With the detection method for an inverter system according to the embodiments of the present disclosure, the saturation state of the sampled signal is effectively determined by directly comparing the first actual value with the determined target threshold. The determination logic is simple and convenient, and easy to operate.

(2) Determining the Saturation State by a Maximum-Minimum Value Difference

In some embodiments, obtaining the target saturation degree of the sampled signal based on the at least one of the first actual value, the maximum amplitude, and the minimum amplitude may further include: obtaining a maximum value and a minimum value of first actual values of a plurality of sampled signals within a target period; and obtaining the target saturation degree based on the maximum value and the minimum value.

In this embodiment, the target period is a period for sampling the inverter system.

The target period may be user-defined or may be determined based on the actual situation, which is not limited in the present disclosure.

During an actual implementation, a set of sampled signals may be obtained by sampling the inverter system within the target period. By comparing the set of sampled signals, the maximum value and the minimum value of the sampled signal may be obtained.

During an actual implementation, the target saturation degree may be obtained by processing the maximum value and the minimum value.

The target saturation degree may be determined according to the following equation:

$$E=f_5(S_{max},S_{min})$$

E being the target saturation degree, $S_{min}$ being the minimum value, $S_{max}$ being the maximum value, and $f_5$ being a fifth functional relationship.

In an embodiment, the target saturation degree may be determined according to the following equation:

$$E=S_{max}-S_{min}$$

E being the target saturation degree, $S_{min}$ being the minimum value, and $S_{max}$ being the maximum value.

During an actual implementation, the maximum value and the minimum value of the sampled signal may be calculated, and the near-saturation degree (i.e., the target saturation degree) is reflected by the maximum-minimum value difference.

A greater maximum-minimum value difference corresponds to a greater near-saturation degree. A smaller maximum-minimum value difference corresponds to a smaller near-saturation degree.

With the detection method for an inverter system according to the embodiments of the present disclosure, the near-saturation degree of the sampled signal is reflected by the difference between the maximum value and the minimum value of the sampled signal, which effectively determines the saturation state of the sampled signal. The determination manner is simple and convenient.

In some embodiments, determining the saturation state of the sampled signal based on the target saturation degree and the target threshold may further include: determining that the sampled signal is saturated in response to the target saturation degree being greater than or equal to the target threshold; and determining that the sampled signal is unsaturated in response to the target saturation degree being smaller than the target threshold.

In this embodiment, the target threshold may be determined according to the following equation:

$$S_t = f_6(S_{imtdn}, S_{imtup}, S_e),$$

$S_t$ being the target threshold, $S_{imtdn}$ being the minimum amplitude, $S_{imtup}$ being the maximum amplitude, $S_e$ being the sensitivity information, and $f_6$ being a sixth functional relationship.

In an embodiment, the target threshold may be determined according to the following equation:

$$S_t = S_e(S_{imtdn} + S_{imtup}),$$

$S_t$ being the target threshold, $S_{imtdn}$ being the minimum amplitude, $S_{imtup}$ being the maximum amplitude, and $S_e$ being the sensitivity information.

During an actual implementation, the saturation state of the sampled signal may be determined by comparing the target saturation degree with the target threshold.

The saturation state may be determined according to the following equation:

$$T = f_7(S_t, E),$$

T being the saturation state, E being the target saturation degree, $S_t$ being the target threshold, and $f_7$ being a seventh functional relationship.

The saturation state may be determined according to the following expression:

$$T = \begin{cases} \text{saturated,} & E \geq S_t \\ \text{unsaturated,} & E < S_t \end{cases},$$

T being the saturation state, E being the target saturation degree, and $S_t$ being the target threshold.

With the detection method for an inverter system according to the embodiments of the present disclosure, by comparing the target saturation degree determined based on the difference between the maximum value and the minimum value with the target threshold, the saturation state of the sampled signal is effectively determined. The determination logic is simple and convenient, which improves the determination efficiency of the saturation state of the sampled signal.

(3) Determining the Saturation State by the Upper Limit and the Lower Limit

In some embodiments, obtaining the target saturation degree of the sampled signal based on at least one of the first actual value, the maximum amplitude, and the minimum amplitude may further include: obtaining a first sub-target saturation degree based on the first actual value and the maximum amplitude; obtaining a second sub-target saturation degree based on the first actual value and the minimum amplitude; and obtaining the target saturation degree based on the first sub-target saturation degree and the second sub-target saturation degree.

In this embodiment, the first sub-target saturation degree may be determined according to the following equation:

$$\Delta E_{up} = f_8(S, S_{imtup})$$

$\Delta E_{up}$ being the first sub-target saturation degree, S being the first actual value, $S_{imtup}$ being the maximum amplitude, and $f_8$ being an eighth functional relationship.

The second sub-target saturation degree may be determined according to the following equation:

$$\Delta E_{dn} = f_9(S, S_{imtdn})$$

$\Delta E_{dn}$ being the second sub-target saturation degree, S being the first actual value, $S_{imtdn}$ being the minimum amplitude, and $f_9$ being a ninth functional relationship.

In some embodiments, the first sub-target saturation degree may be determined according to the following equation:

$$\Delta E_{up} = (S - S_{imtup})^2,$$

$\Delta E_{up}$ being the first sub-target saturation degree, S being the first actual value, and $S_{imtup}$ being the maximum amplitude.

The second sub-target saturation degree may also be determined according to the following equation:

$$\Delta E_{dn} = (S - S_{imtdn})^2$$

$\Delta E_{dn}$ being the second sub-target saturation degree, S being the first actual value, $S_{imtdn}$ being the minimum amplitude.

It should be understood that the maximum amplitude is greater than or equal to the minimum amplitude, and the sign of the difference between the maximum amplitude and the first actual value or between the minimum amplitude and the first actual value may be controlled based on the maximum amplitude and the minimum amplitude.

In other embodiments, the first sub-target saturation degree may be determined according to the following equation:

$$\Delta E_{up} = S_{imtup} - S,$$

$\Delta E_{up}$ being the first sub-target saturation degree, S being the first actual value, and $S_{imtup}$ being the maximum amplitude.

The second sub-target saturation degree may be determined according to the following equation:

$$\Delta E_{dn} = S - S_{imtdn},$$

$\Delta E_{dn}$ being the second sub-target saturation degree, S being the first actual value, $S_{imtdn}$ being the minimum amplitude.

In this embodiment, in response to $S \geq S_{imtup}$, the sampled signal is saturated. In this case, $\Delta E_{up} > 0$.

In response to $S \leq S_{imtup}$, the sampled signal is saturated. At this time, $\Delta E_{dn} > 0$.

With the detection method for an inverter system according to the embodiments of the present disclosure, by determining the target saturation degree based on the difference between the maximum amplitude and the first actual value and the difference between the minimum amplitude and the first actual value, the saturation state of the sampled signal is effectively determined based on the obtained target saturation degree. The determination logic is simple and convenient.

In some embodiments, determining the saturation state of the sampled signal based on the target saturation degree and the target threshold may further include: determining that the sampled signal is saturated in response to the first sub-target saturation degree being smaller than or equal to the target threshold or the second sub-target saturation degree being smaller than or equal to the target threshold; and determining that the sampled signal is unsaturated in response to the first sub-target saturation degree being greater than the target threshold and the second sub-target saturation degree being greater than the target threshold.

In this embodiment, the target threshold may be determined according to the following equation:

$$S_t = f_{10}(S_{imtdn}, S_{imtup}, S_e),$$

$S_t$ being the target threshold, $S_{imtdn}$ being the minimum amplitude, $S_{imtup}$ being the maximum amplitude, $S_e$ being the sensitivity information, and $f_{10}$ being a tenth functional relationship.

In an embodiment, the target threshold may be determined according to the following equation:

$$S_t = (1 - S_e)(S_{imtdn} + S_{imtup})$$

$S_t$ being the target threshold, $S_{imtdn}$ being the minimum amplitude, $S_{imtup}$ being the maximum amplitude, and $S_e$ being the sensitivity information.

The saturation state may be determined according to the following expression:

$$T = \begin{cases} \text{saturated}, & \Delta E_{up} \leq S_t \text{ or } \Delta E_{dn} \leq S_t \\ \text{unsaturated}, & \Delta E_{up} > S_t \text{ and } \Delta E_{dn} > S_t \end{cases},$$

T being the saturation state, $\Delta E_{up}$ being the first sub-target saturation degree, and $\Delta E_{dn}$ being the second sub-target saturation degree.

With the detection method for an inverter system according to the embodiments of the present disclosure, by comparing the first sub-target saturation degree and the second sub-target saturation degree with the target threshold, the saturation state of the sampled signal is effectively determined. The determination logic is simple and easy to operate, and the saturation state determination is highly efficient.

In a second manner, the saturation state is determined through inductive electrical signal analysis.

In some embodiments, in response to the sampled signal being the inductive electrical signal, step 120 may further include: determining the saturation state of the inductive electrical signal based on the first actual value of the inductive electrical signal, the input voltage of the inverter system, and the switching frequency of the switching tube in the inverter system.

In this embodiment, during an actual implementation, the inductor suppresses a current change. When the inductance of the inductor is small or resonance occurs in the circuit, the inductor cannot effectively suppress input current fluctuation, which leads to the increase of the sampled signal, thereby causing the sampled signal to approach saturation or be saturated.

During an actual implementation, a current ripple capable of characterizing the saturation state of the inductive electrical signal may be obtained through the first actual value of the inductive electrical signal, the input voltage of the inverter system, and the switching frequency of the switching tube in the inverter system, to determine the saturation state of the inductive electrical signal based on the obtained current ripple.

With the detection method for an inverter system according to the embodiments of the present disclosure, the current ripple of the inductive electrical signal is calculated by using the collected inductive electrical signal, the input voltage of the inverter system, and the switching frequency of the switching tube in the inverter system, to determine the saturation degree of the sampled signal based on the current ripple of the inductive electrical signal, and determine the saturation state of the sampled signal effectively. The determination manner is simple and convenient.

In some embodiments, determining the saturation state of the inductive electrical signal based on the first actual value of the inductive electrical signal, the input voltage of the inverter system, and the switching frequency of the switching tube in the inverter system may further include: obtaining a target current ripple based on at least one of the first actual value of the inductive electrical signal, the input voltage of the inverter system, and the switching frequency of the switching tube in the inverter system; obtaining a target ripple threshold based on the inductive electrical signal and inductive current sensitivity information; and determining the saturation state of the inductive electrical signal based on the target current ripple and the target ripple threshold.

In this embodiment, the target current ripple is a current ripple calculated based on the first actual value of the inductive electrical signal.

The target current ripple may be used for determining the saturation state of the inductive electrical signal.

The target ripple threshold is a set value for determining the saturation state of the inductive electrical signal.

The inductive current sensitivity information is determined based on a ratio of a maximum value corresponding to a current ripple range of the inductive electrical signal to a first actual value of the inductive electrical signal.

During an actual implementation, ranges of normal current ripples of different inductive electrical signals are obtained through experiments, and the inductive current sensitive information is determined based on a ratio of a maximum value of the normal current ripples to an inductive current.

When the current ripple becomes abnormally large, it indicates that a risk of sampling saturation occurs under an operation condition at a current collection moment.

The target ripple threshold may be determined according to the following equation:

$$\Delta I_{Lt} = S_i I_L,$$

$\Delta I_{Lt}$ being the target ripple threshold, $I_L$ being the inductive current, and $S_i$ being the inductive current sensitivity information.

During an actual implementation, the target current ripple of the inductive electrical signal may be calculated based on the inductive electrical signal. An association relationship between the target current ripple $\Delta I_L$ of the inductive electrical signal of the designed photovoltaic inverter and the inductive current sensitive information $S_i$ may be evaluated through experimental tests, to determine whether the sampled signal is saturated.

In some embodiments, obtaining the target current ripple based on at least one of the first actual value of the inductive electrical signal, the input voltage of the inverter system, and the switching frequency of the switching tube in the inverter system may further include: obtaining a maximum inductive current value and a minimum inductive current value of first actual values of a plurality of inductive electrical signals within a target period; and obtaining the target current ripple based on the maximum inductive current value and the minimum inductive current value.

In this embodiment, the maximum inductive current value is a maximum one of the first actual values of respective inductive electrical signals within the target period.

The minimum inductive current value is a minimum one of the first actual values of respective inductive electrical signals within the target period.

The target current ripple may be determined according to the following equation:

$$\Delta I_L = I_{Lmax} - I_{Lmin},$$

$\Delta I_L$ being the target current ripple, $I_{Lmax}$ being the maximum inductive current value, and $I_{Lmin}$ being the minimum inductive current value.

With the detection method for an inverter system according to the embodiments of the present disclosure, the target current ripple is obtained based on the difference between the maximum inductive current value and the minimum inductive current value among the actual values of respective inductive electrical signals within the target period, to reflect the saturation degree of the inductive electrical signal, thereby efficiently determining the saturation state of the inductive electrical signal. The determination manner is simple and convenient.

In some embodiments, obtaining the target current ripple based on at least one of the first actual value of the inductive electrical signal, the input voltage of the inverter system, and the switching frequency of the switching tube in the inverter system may further include: obtaining the target current ripple based on the first actual value of the inductive electrical signal, the input voltage of the inverter system, and the switching frequency of the switching tube in the inverter system.

In this embodiment, the current ripple of the inductive electrical signal may be determined according to the following equation:

$$\Delta I_L = f_{12}(L, V, f)$$

$\Delta I_L$ being the target current ripple, L being the first actual value of the inductive electrical signal, I being the input voltage of the inverter system, f being the switching frequency of the switching tube, and $f_{12}$ being a twelfth functional relationship.

In an embodiment, the target current ripple may be determined according to the following equation:

$$\Delta I_L = V/fL,$$

$\Delta I_L$ being the target current ripple, L being the first actual value of the inductive electrical signal, V being the input voltage of the inverter system, f being the switching frequency of the switching tube.

With the detection method for an inverter system according to the embodiments of the present disclosure, the target current ripple calculated from the first actual value of the inductive electrical signal, the input voltage of the inverter system, and the switching frequency of the switching tube is scientific and rational, and effectively reflects the saturation degree of the inductive electrical signal.

During an actual implementation, after the target current ripple and the target ripple threshold are obtained, the target current ripple and the target ripple threshold may be compared to determine an association relationship between the target current ripple and the target ripple threshold, so as to determine the saturation state of the inductive electrical signal.

The saturation state of the inductive electrical signal may be determined according to the following equation:

$$T = f_{14}(\Delta I_{Lt}, \Delta I_L),$$

T being the saturation state, $\Delta I_{Lt}$ being the target ripple threshold, $\Delta I_L$ being the target current ripple, and $f_{14}$ being a fourteenth functional relationship.

With the detection method for the inverter according to the embodiments of the present disclosure, the target current ripple is determined based on the maximum inductive current value and the minimum inductive current value of the inductive electrical signal and by calculating the difference between the maximum inductive current value and the minimum inductive current value, and the target ripple threshold is determined based on the inductive current sensitivity information and the inductive current, so that the saturation state of the inductive electrical signal is determined based on the association relationship between the target current ripple and the target ripple threshold. The determination condition obtained by processing the inductive electrical signal is scientific and rational, and can improve the accuracy of the determination of the saturation state.

In some embodiments, determining the saturation state of the inductive electrical signal based on the target current ripple and the target ripple threshold may further include: determining that the inductive electrical signal is saturated in response to the target current ripple being greater than or equal to the target ripple threshold; and determining that the inductive electrical signal is unsaturated in response to the target current ripple being smaller than the target ripple threshold.

In this embodiment, during an actual implementation, the saturation state of the inductive electrical signal may be determined by comparing the target current ripple with the target ripple threshold.

The saturation state of the inductive electrical signal may be determined according to the following expression:

$$T = \begin{cases} \text{saturated}, & \Delta I_L \geq \Delta I_{Lt} \\ \text{unsaturated}, & \Delta I_L < \Delta I_{Lt} \end{cases},$$

T being the saturation state, $\Delta I_L$ being the target current ripple, and $\Delta I_{Lt}$ being the target ripple threshold.

With the detection method for an inverter system according to the embodiments of the present disclosure, the saturation state of the inductive electrical signal is effectively determined by comparing the target current ripple with the target ripple threshold. The determination logic is simple and easy to implement.

In a third manner, the saturation state is determined through algorithm detection.

In some embodiments, step 120 may further include: performing transformation on the first actual value to obtain target transformation data; performing algorithm analysis on the target transformation data to obtain an algorithm analysis result; and determining the saturation state of the sampled signal based on the algorithm analysis result.

In this embodiment, the target transformation data is data obtained after the transformation is performed on the first actual value of the sampled signal.

The algorithm analysis result is a result that is capable of characterizing the saturation state of the sampled signal and is obtained by performing the algorithm analysis on the processed data.

The method for the transformation may include fast Fourier transform, wavelet transform, and other methods.

During an actual implementation, before the transformation is performed on the first actual value, data pre-processing may be performed on the first actual value, and data post-processing may be performed on the target transformation data obtained after the transformation is performed.

The data pre-processing and the data post-processing may also vary correspondingly to facilitate subsequent algorithm analysis.

Of course, the data pre-processing and data post-processing may be performed on the sampled signal in any applicable manner, which is not limited in the present disclosure.

The data pre-processing may be operations such as checking the collected data and supplementing a missing value.

The data post-processing may be operations such as performing normalization processing on the target transformation data.

In some embodiments, the entire dataset collected within the target period may be segmented into lists of a same length. Then, the fast Fourier transform is applied to data in each list to obtain the target transformation data.

In other embodiments, abnormal maximum-minimum value processing may be performed on the entire dataset sampled within the target period, and the sampled dataset is checked to supplement an insufficient data length or missing values. Then, the wavelet transform is applied to the entire dataset to obtain the target transformation data.

The methods for algorithm analysis may include: prefabricated expert experience, linear regression, machine learning, a neural network, a convolutional neural network, and a recurrent neural network.

In some embodiments, a plurality of algorithm analysis models may be fused, and the algorithm analysis is performed based on the fused model.

During an actual implementation, the sampled signal may be converted from a time domain to a frequency domain by performing the transformation on the first actual value, to obtain a frequency spectrogram corresponding to the sampled signal. The algorithm analysis result characterizing the spectral characteristic may be obtained by performing characteristic identification, i.e., by performing algorithm analysis on the obtained frequency spectrogram, to determine the saturation state of the sampled signal based on the spectral characteristic in the algorithm analysis result.

As shown in FIG. 3, after the first actual value of the sampled signal is obtained, the data pre-processing may be performed on the first actual value, and the transformation may be performed on the pre-processed data to obtain the target transformation data. The algorithm analysis may be performed based on the target transformation data to determine the saturation state of the sampled signal.

With the detection method for an inverter system according to the embodiments of the present disclosure, by performing the transformation on the first actual value of the sampled signal, an accuracy degree of the data is improved, and a use scenario of the data is expanded, making the data have universality. The algorithm analysis is performed based on the processed data, to obtain the algorithm analysis result, thereby determining the saturation state of the sampled signal, which improves the accuracy of the determination of the saturation state of the sampled signal.

In some embodiments, performing the algorithm analysis on the target transformation data to obtain the algorithm analysis result may include: grouping the target transformation data to obtain at least one target data group; calculating statistical information corresponding to each of the at least one target data group; determining weight information of each of the at least one target data group based on the statistical information; and performing the algorithm analysis based on the weight information and each of the at least one target data group to obtain an algorithm analysis result.

In this embodiment, the target data group is a data group obtained by grouping the target transformation data.

The quantity of data included in the target data group may be user-defined or determined based on the actual situation, which is not limited in the present disclosure.

During an actual implementation, the target data may be grouped in any applicable manner, which is not limited in the present disclosure.

For example, the target transformation data may be divided into a total of 10 groups or 20 groups.

For another example, a plurality of target data groups is obtained by grouping the data in such a way that each group of the data includes 10 pieces of data.

The statistical information is information obtained by performing the statistical analysis on the data in the target data group.

The statistical information may be statistical data such as a mean value corresponding to the target data group and maximum and minimum values corresponding to the target data group.

The weight information is used for characterizing an importance degree of the data corresponding to the target data group.

During an actual implementation, the target transformation data is grouped to obtain the plurality of target data groups. Then, the statistical analysis is performed on each target data group. For example, the maximum and minimum values corresponding to each target data group and the mean value corresponding to each target data group are calculated. Moreover, the weight information is assigned to each target data group based on the maximum and minimum values corresponding to the target data group and the mean value corresponding to the target data group, and is added to the target data group. The algorithm analysis is performed on the target data group containing the weighting information to obtain the saturation state of the sampled signal.

With the method for detecting the inverter according to the embodiments of the present disclosure, the target data group is obtained by grouping the target transformation data, and the statistical analysis is performed on each target data group. The data is divided into small data units for statistical analysis, which improves the data analysis efficiency and can accurately obtain a data characteristic. The weight is assigned to each target data group based on the statistical information of the data, to effectively determine the importance degree of each target data group. Moreover, the determination manner is based on a characteristic of the data group itself, and is scientific, thereby improving an accuracy degree of the subsequent determination for the saturation state of the sampled signal.

In some embodiments, determining the saturation state of the sampled signal based on the algorithm analysis result may include: determining a spectral characteristic based on the algorithm analysis result; and determining the saturation state of the sampled signal based on the spectral characteristic.

In this embodiment, in response to the sampled signal being saturated, spectral diffusion in the frequency domain is caused. The spectral characteristic may be determined based on the algorithm analysis result to obtain the saturation state of the sampled signal.

For example, in response to the spectral characteristic being the spectral diffusion, it may be determined that the saturation state of the sampled signal is saturated.

In response to the spectral characteristic being no spectral diffusion, it may be determined that the saturation state of the sampled signal is unsaturated.

Figure 4:
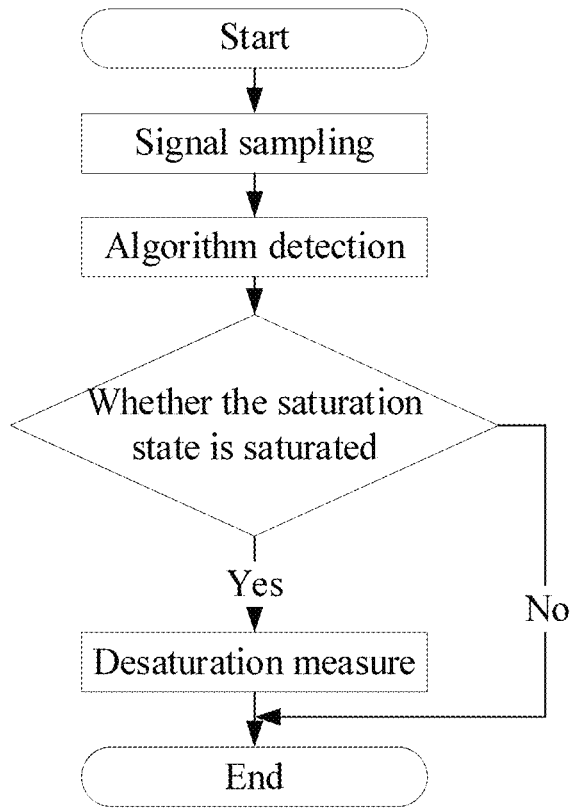
FIG. 4 is a schematic flowchart of a detection method for an inverter system according to an embodiment of the present disclosure.

As shown in FIG. 4, in response to determining that the sampled signal is saturated through the algorithm detection, the desaturation processing may be performed on the sampled signal to obtain the unsaturated sampled signal.

With the detection method for an inverter system according to the embodiments of the present disclosure, the spectral characteristic corresponding to the sampled signal may be obtained through the algorithm analysis result. The saturation state of the sampled signal is effectively determined based on an actual situation of the spectral characteristic. The determination manner is simple and easy to understand.

In some embodiments, determining the saturation state of the sampled signal based on the spectral characteristic may include: determining an arc state based on the spectral characteristic, where the arc state includes arc generation or no arc generation; and determining the saturation state of the sampled signal based on the arc state.

In this embodiment, the arc state includes: the arc generation or no arc generation.

In response to the sampled signal being saturated, the spectral diffusion in the frequency domain is caused, and the spectral diffusion may characterize the arc generation. At this time, the arc state may be determined based on the spectral characteristic to obtain the saturation state of the sampled signal.

For example, in response to the spectral characteristic being the spectral diffusion, it is determined that the arc state is the arc generation, and it may be determined that the saturation state of the sampled signal is saturated.

In response to the spectral characteristic being the no spectral diffusion, it is determined that the arc state is no arc generation, and it may be determined that the saturation state of the sampled signal is unsaturated.

Figure 5:
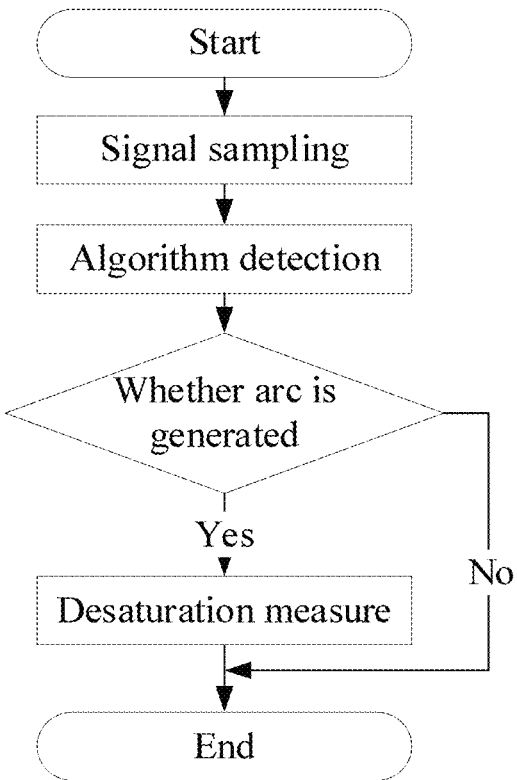
FIG. 5 is a schematic flowchart of a detection method for an inverter system according to an embodiment of the present disclosure.

As shown in FIG. 5, it may be determined whether an arc is generated in the sampled signal through the algorithm detection, and the arc state is determined based on the spectral state of the algorithm detection result, to obtain the saturation state of the sampled signal. In response to the arc generation, it is determined that the sampled signal is saturated, and the desaturation measure may be performed on the sampled signal.

With the detection method for an inverter system according to the embodiments of the present disclosure, the saturation state of the sampled signal is effectively determined through the arc state corresponding to the algorithm analysis result. In response to determining that an arc is generated, it is effectively determined that the sampled signal is saturated. The determination logic is simple and easy to implement.

During an actual implementation, the user may determine the saturation state of the sampled signal based on the actual application scenario by flexible selecting a suitable determination manner from various manners of determining the saturation state through the AD sampling analysis, inductive electrical signal analysis, or algorithmic detection. The determination manner has flexibility and a wide applicable scenario.

The execution subject of the detection method for an inverter system according to the embodiments of the present disclosure may be a detection device for the inverter system. In an embodiment of the present disclosure, the detection device for the inverter system performing the detection method for an inverter system is taken as an example to describe the detection device for the inverter system according to the embodiments of the present disclosure.

According to an embodiment of the present disclosure, a detection device for an inverter system is further provided.

The inverter system is connected to an arc detection system.

Figure 6:
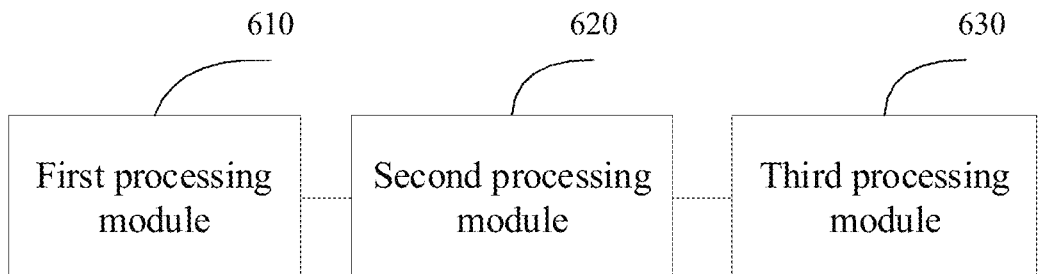
FIG. 6 is a schematic structural diagram of a detection device for an inverter system according to an embodiment of the present disclosure.

As shown in FIG. 6, the detection device for an inverter system includes: a first processing module 610, a second processing module 620, and a third processing module 630.

The first processing module 610 is configured to obtain a first actual value of a sampled signal obtained through sampling for the inverter system by the arc detection system. The sampled signal is an input electrical signal or an inductive electrical signal of the inverter system.

The second processing module 620 is configured to determine a saturation state of the sampled signal based on at least one of the first actual value, a maximum amplitude corresponding to the sampled signal, and a minimum amplitude corresponding to the sampled signal. The saturation state includes saturated or unsaturated.

The third processing module 630 is configured to perform arc detection based on the saturation state.

With the detection device for an inverter system according to the embodiments of the present disclosure, the sampled signal is obtained by sampling the inverter system, and the saturation detection is performed on the sampled signal to determine the saturation state of the sampled signal, to perform the arc detection based on the actual situation of the sampled signal, such that the saturation state of the sampled signal can be effectively determined. In response to the sampled signal being saturated, the desaturation measure is performed to ensure that the sampled signal is not distorted, to improve the accuracy of the arc detection and ensure the integrity of the arc detection.

In some embodiments, the second processing module 620 may further be configured to: obtain a target saturation degree of the sampled signal based on at least one of the first actual value, the maximum amplitude, and the minimum amplitude; obtain a target threshold based on the maximum amplitude, the minimum amplitude, and sensitivity information, where the sensitivity information is determined based on an association relationship between the target saturation degree and an accuracy degree of the arc detection result of the inverter system; and determine the saturation state of the sampled signal based on at least two of the target saturation degree, the first actual value, and the target threshold.

In some embodiments, the second processing module 620 may further be configured to: determine a first threshold based on the sensitivity information, the maximum amplitude, and the minimum amplitude, where the first threshold is smaller than or equal to a first ratio determined based on the maximum amplitude and a first difference, and the first difference is determined based on the maximum amplitude and the minimum amplitude; determine a second threshold based on a target value, the sensitivity information, the maximum amplitude, and the minimum amplitude, where the second threshold is greater than or equal to a second ratio determined based on the minimum amplitude and the first difference, and the second threshold is smaller than the first threshold; and determine the target threshold based on the first threshold and the second threshold.

In some embodiments, the second processing module 620 may further be configured to: obtain the target saturation degree based on the first actual value, the maximum amplitude, and the minimum amplitude.

In some embodiments, the second processing module 620 may further be configured to: determine that the sampled signal is saturated in response to the target saturation degree being greater than or equal to the first threshold or the target saturation degree being smaller than or equal to the second threshold; and determine that the sampled signal is unsaturated in response to the target saturation degree being greater than the second threshold and the target saturation degree being smaller than the first threshold.

In some embodiments, the second processing module 620 may further be configured to: determine that the sampled signal is saturated in response to the first actual value being greater than or equal to the first threshold or the first actual value being smaller than or equal to the second threshold; and determine that the sampled signal is unsaturated in response to the first actual value being greater than the second threshold and the first actual value being smaller than the first threshold.

In some embodiments, the second processing module 620 may further be configured to: obtain a maximum value and a minimum value of first actual values of a plurality of sampled signal within a target period; and obtain the target saturation degree based on the maximum value and the minimum value.

In some embodiments, the second processing module 620 may further be configured to: determine that the sampled signal is saturated in response to the target saturation degree being greater than or equal to the target threshold; and determine that the sampled signal is unsaturated in response to the target saturation degree being smaller than the target threshold.

In some embodiments, the second processing module 620 may further be configured to: obtain a first sub-target saturation degree based on the first actual value and the maximum amplitude; obtain a second sub-target saturation degree based on the first actual value and the minimum amplitude; and obtain the target saturation degree based on the first sub-target saturation degree and the second sub-target saturation degree.

In some embodiments, the second processing module 620 may further be configured to: determine that the sampled signal is saturated in response to the first sub-target saturation degree being smaller than or equal to the target threshold or the second sub-target saturation degree being smaller than or equal to the target threshold; and determine that the sampled signal is unsaturated in response to the first sub-target saturation degree being greater than the target threshold and the second sub-target saturation degree being greater than the target threshold.

In some embodiments, the second processing module 620 may further be configured to: determine a saturation state of the inductive electrical signal based on the first actual value of the inductive electrical signal, the input voltage of the inverter system, and the switching frequency of the switching tube in the inverter system.

In some embodiments, the second processing module 620 may further be configured to: obtain a target current ripple based on at least one of the first actual value of the inductive electrical signal, the input voltage of the inverter system, and the switching frequency of the switching tube in the inverter system; obtain a target ripple threshold based on the inductive electrical signal and inductive current sensitivity information, where the inductive current sensitivity information is determined based on a ratio of a maximum value corresponding to a current ripple range of the inductive electrical signal to the first actual value of the inductive electrical signal; and determine the saturation state of the inductive electrical signal based on the target current ripple and the target ripple threshold.

In some embodiments, the second processing module 620 may further be configured to: obtain a maximum inductive current value and a minimum inductive current value of first actual values of a plurality of inductive electrical signals within a target period; and obtain the target current ripple based on the maximum inductive current value and the minimum inductive current value.

In some embodiments, the second processing module 620 may further be configured to: obtain the target current ripple based on the first actual value of the inductive electrical signal, the input voltage of the inverter system, and the switching frequency of the switching tube in the inverter system.

In some embodiments, the second processing module 620 may further be configured to: determine that the inductive electrical signal is saturated in response to the target current ripple being greater than or equal to the target ripple threshold; and determine that the inductive electrical signal is unsaturated in response to the target current ripple being smaller than the target ripple threshold.

In some embodiments, the second processing module 620 may further be configured to: perform transformation on the first actual value to obtain target transformation data; perform algorithm analysis on the target transformation data to obtain an algorithm analysis result; and determine the saturation state of the sampled signal based on the algorithm analysis result.

In some embodiments, the second processing module 620 may further be configured to: group the target transformation data to obtain at least one target data group; calculate statistical information corresponding to each of the at least one target data group; determine weight information of each of the at least one target data group based on the statistical information; and perform the algorithm analysis based on the weight information and each of the at least one target data group to obtain an algorithm analysis result.

In some embodiments, the second processing module 620 may further be configured to: determine a spectral characteristic based on the algorithm analysis result; and determine the saturation state of the sampled signal based on the spectral characteristic.

In some embodiments, the second processing module 620 may further be configured to: determine an arc state based on the spectral characteristic, in which the arc state includes arc generation or no arc generation; and determine the saturation state of the sampled signal based on the arc state.

In some embodiments, the third processing module 630 may further be configured to: perform the desaturation processing on the sampled signal in response to the saturation state being saturated to obtain an unsaturated sampled signal; and perform the arc detection based on the unsaturated sampled signal.

In some embodiments, the third processing module 630 may further be configured to: perform the desaturation processing on the sampled signal by adjusting at least one of the input voltage of the inverter system, the input current of the inverter system, the bus voltage of the inverter system, and the switching frequency of the switching tube in the inverter system to obtain the unsaturated sampled signal.

In some embodiments, the third processing module 630 may further be configured to: adjust at least one of a bus voltage corresponding to the inverter system, a bus voltage corresponding to a battery pack electrically connected to an inverter, and a bus voltage corresponding to a charging pile electrically connected to the inverter, to perform the desaturation processing on the sampled signal to obtain the unsaturated sampled signal.

The detection device for an inverter system in the embodiments of the present disclosure may be the inverter system, or may be an electronic device in communication connection with the inverter system, or a component in the electronic device, such as an integrated circuit or a chip. The electronic device may be a terminal or a device other than the terminal. Exemplarily, the electronic device may be a mobile phone, a tablet computer, a laptop computer, a handheld computer, an in-vehicle electronic device, a mobile internet device (MID), an augmented reality (AR)/virtual reality (VR) device, a robot, a wearable device, an ultra-mobile personal computer (UMPC), a netbook or a personal digital assistant (PDA), or the like. The electronic device may also be a server, a network attached storage (NAS), a personal computer (PC), a television (TV), a teller machine, a self-service machine, or the like, and the embodiments of the present disclosure is not specifically limited in this regard.

The detection device for the inverter system in the embodiments of the present disclosure may be an apparatus having an operation system. The operation system may be an Android operation system, an IOS operation system, or other possible operation systems, which is not limited in the embodiments of the present disclosure.

The detection device for an inverter system according to the embodiments of the present disclosure may realize various processes implemented by method embodiments shown in FIG. 1 to FIG. 5, and details are omitted here for avoiding repetition.

An inverter system is further provided according to the embodiments of the present disclosure.

In some embodiments, the inverter system performs detection based on the detection method for an inverter system as described in any one of the above embodiments.

With the inverter system according to the embodiments of the present disclosure, a sampled signal is obtained by sampling the inverter system, and saturation detection is performed on the sampled signal to determine the saturation state of the sampled signal, to perform the arc detection based on the actual situation of the sampled signal, such that the saturation state of the sampled signal can be effectively determined. In response to the sampled signal being saturated, the desaturation measure is performed to ensure that the sampled signal is not distorted, to improve the accuracy of the arc detection and ensure the integrity of the arc detection.

In some embodiments, the inverter system is configured to be electrically connected to at least one of a battery pack and a charging pile.

In an embodiment, the inverter system may be a photovoltaic inverter.

The photovoltaic inverter may be used in conjunction with the battery pack and the charging pile.

Figure 7:
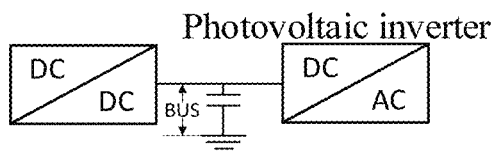
FIG. 7 is a schematic structural diagram of an inverter system according to an embodiment of the present disclosure.

A structure of the photovoltaic inverter is shown in FIG. 7.

Figure 8:
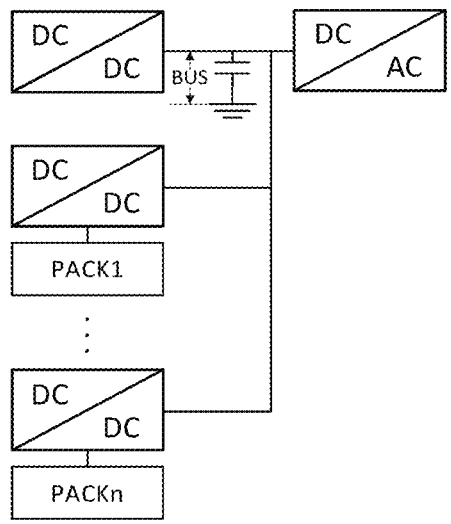
FIG. 8 is a schematic structural diagram of an inverter system according to an embodiment of the present disclosure.

As shown in FIG. 8, in some embodiments, the photovoltaic inverter is used in conjunction with at least one battery pack to obtain a photovoltaic energy storage device.

In some embodiments, the charging pile includes: a direct-current charging pile and an alternating-current charging pile.

Figure 9:
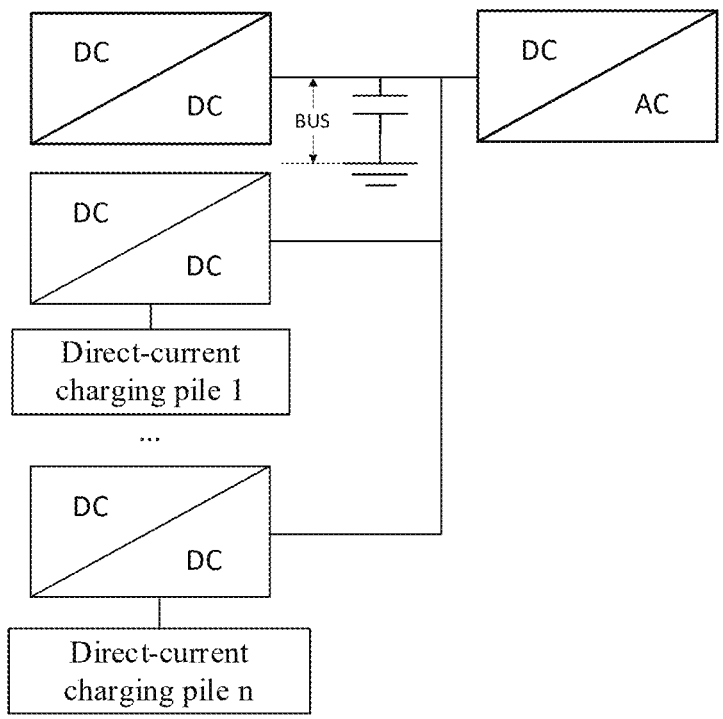
FIG. 9 is a schematic structural diagram of an inverter system according to an embodiment of the present disclosure.

As shown in FIG. 9, in some embodiments, the photovoltaic inverter is used in conjunction with the direct-current charging pile to obtain a direct-current photovoltaic-charging pile device.

Figure 10:
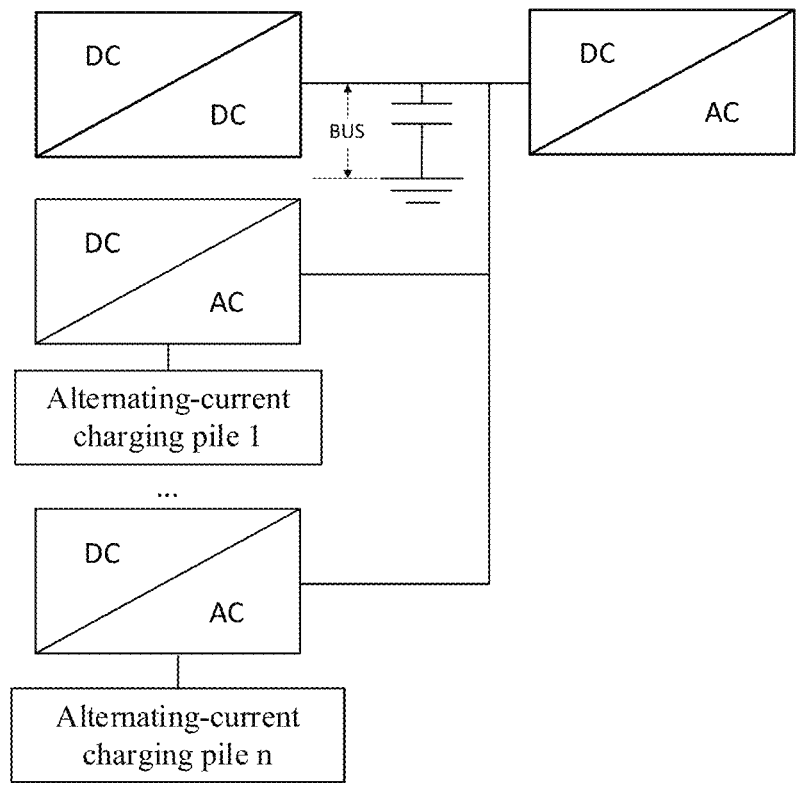
FIG. 10 is a schematic structural diagram of an inverter system according to an embodiment of the present disclosure.

As shown in FIG. 10, in some embodiments, the photovoltaic inverter is used in conjunction with the alternating-current charging pile to obtain a alternating-current photovoltaic-charging pile device.

Figure 11:
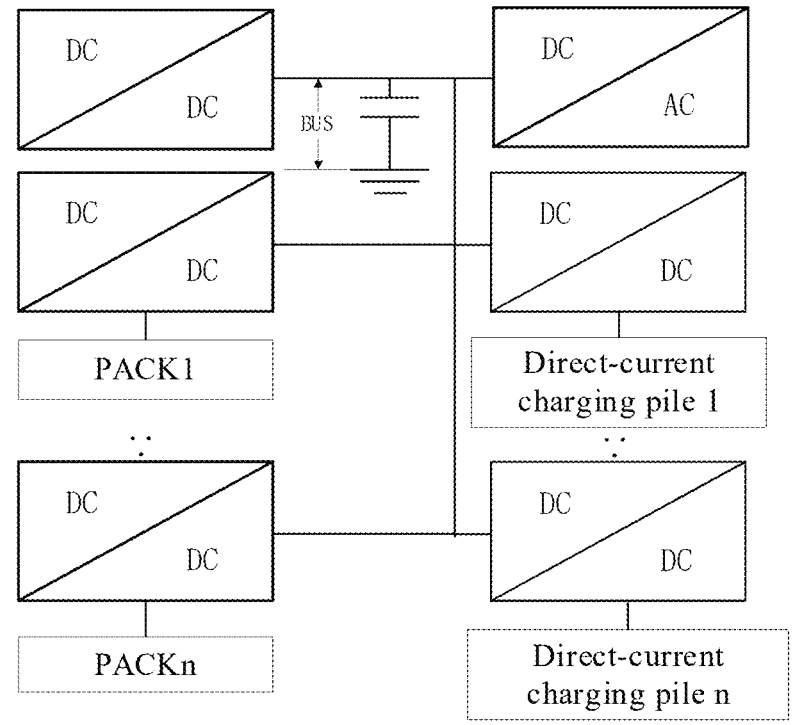
FIG. 11 is a schematic structural diagram of an inverter system according to an embodiment of the present disclosure.

As shown in FIG. 11, in some embodiments, the photovoltaic inverter, the battery pack, and the direct-current charging pile are used in conjunction to obtain a direct-current photovoltaic-storage-charging pile device.

Figure 12:
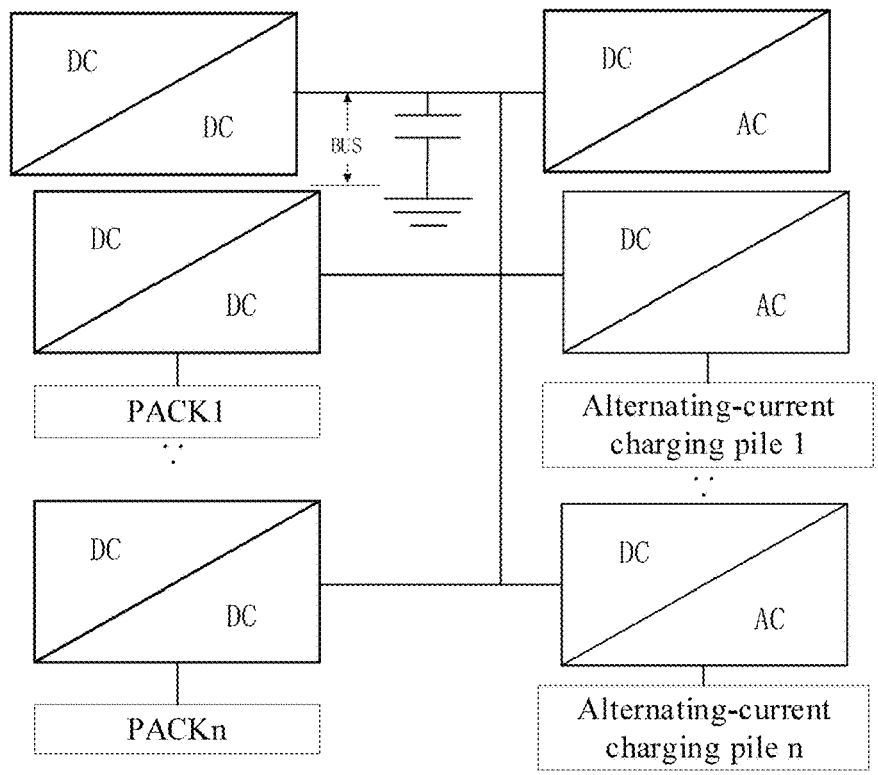
FIG. 12 is a schematic structural diagram of an inverter system according to an embodiment of the present disclosure.

As shown in FIG. 12, in some embodiments, the photovoltaic inverter, the battery pack, and the alternating-current charging pile are used in conjunction to obtain a alternating-current photovoltaic-storage-charging pile device.

Figure 13:
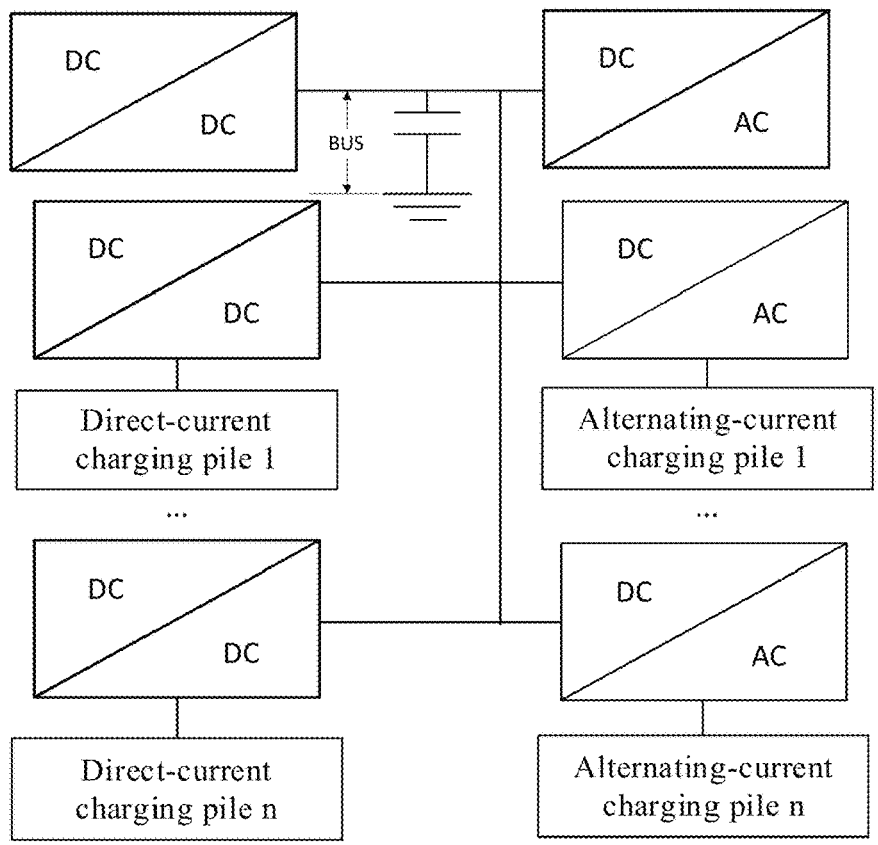
FIG. 13 is a schematic structural diagram of an inverter system according to an embodiment of the present disclosure.

As shown in FIG. 13, in some embodiments, the photovoltaic inverter, the direct-current charging pile, and the alternating-current charging pile are used in conjunction to obtain a photovoltaic-charging alternating-current pile device and a photovoltaic-charging direct-current pile device.

Figure 14:
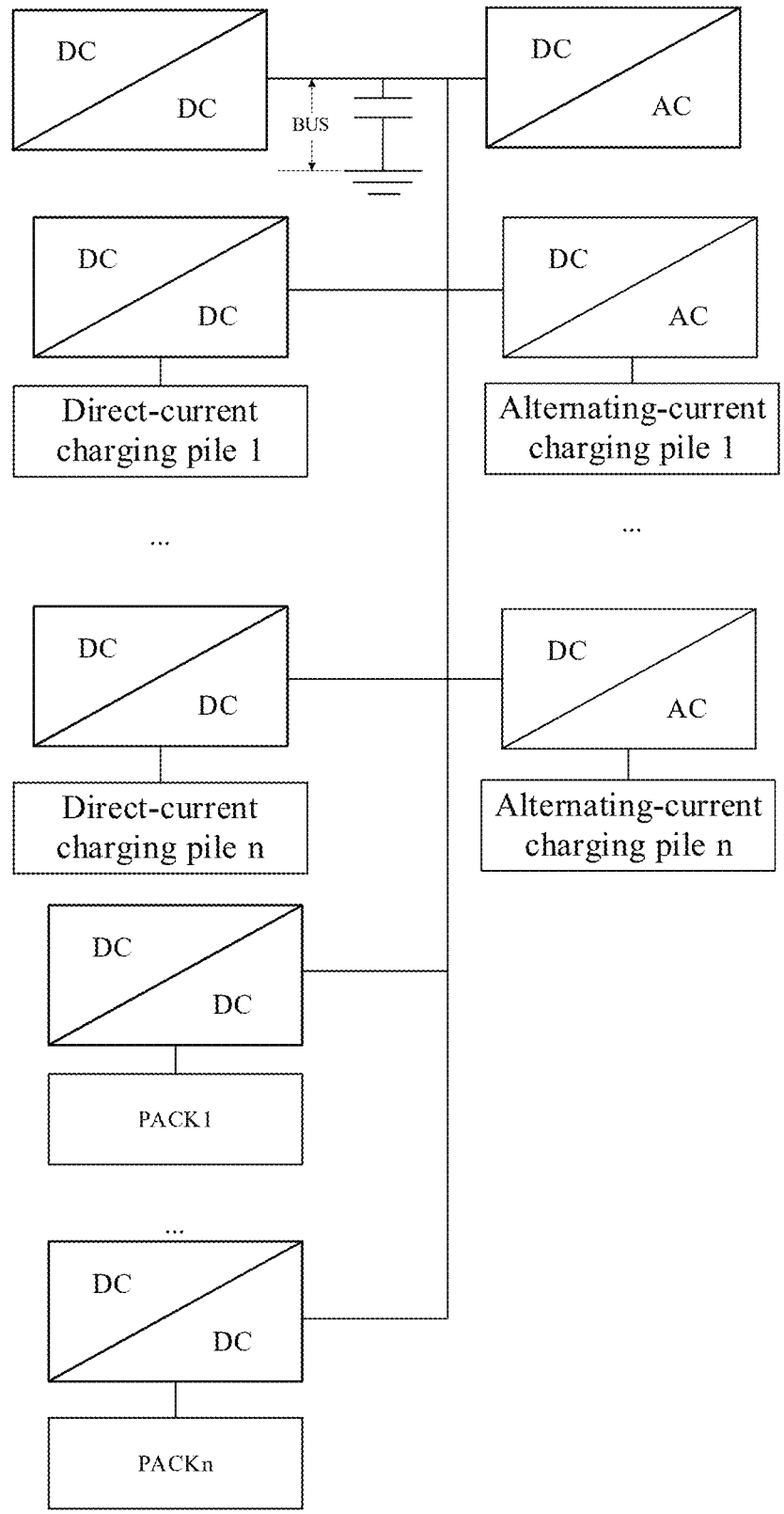
FIG. 14 is a schematic structural diagram of an inverter system according to an embodiment of the present disclosure.

As shown in FIG. 14, in some embodiments, the photovoltaic inverter, the battery pack, the direct-current charging pile, and the alternating-current charging pile are used in conjunction to obtain a alternating-current photovoltaic-storage-charging pile and direct-current photovoltaic-storage-charging pile device.

With the inverter system according to the embodiments of the present disclosure, by combining the photovoltaic inverter, the battery pack, and the charging pile, a variety of connection manners may be obtained for use by the user. The user may flexibly combine the photovoltaic inverter, the battery pack, and the charging pile based on the actual use scenario, with a wide range of application scenarios, improving the user experience.

According to an embodiment of the present disclosure, it is further provided an arc detection system based on the detection method for an inverter system as described in any one of the above embodiments.

In some embodiments, the arc detection system further includes: a sampling module and a signal processing module.

In this embodiment, the sampling module is configured to collect the sampled signal of the inverter system.

The signal processing module is configured to process the sampled signal.

Figure 15:
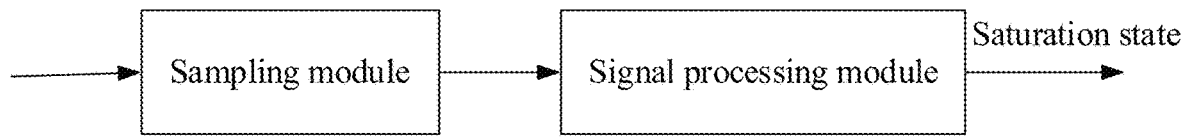
FIG. 15 is a schematic structural diagram of an arc detection system according to an embodiment of the present disclosure.

As shown in FIG. 15, during an actual implementation, the sampled signal obtained through collection by the sampling module is processed by the signal processing module to obtain the saturation state of the sampled signal.

Figure 16:
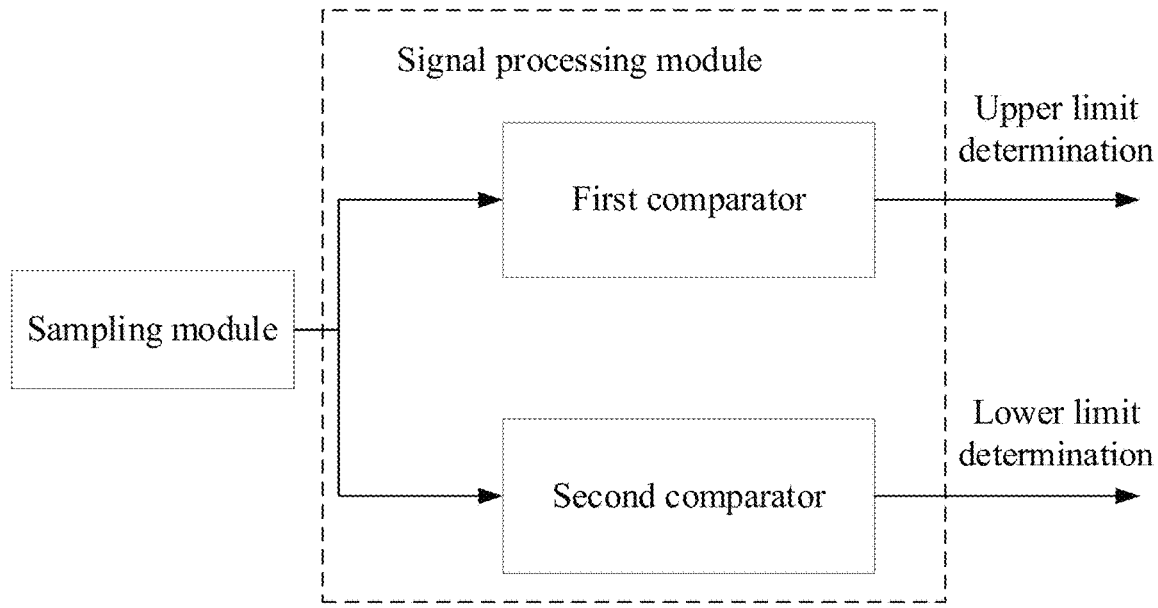
FIG. 16 is a schematic structural diagram of an arc detection system according to an embodiment of the present disclosure.

As shown in FIG. 16, in some embodiments, the signal processing module may further include: a first comparator and a second comparator.

In this embodiment, the first comparator is configured to make upper limit determination on the sampled signal, i.e., to determine whether the sampled signal is greater than or equal to the maximum amplitude. The second comparator is configured to make lower limit determination on the sampled signal, i.e., to determine whether the sampled signal is smaller than or equal to the minimum amplitude.

The first comparator may be configured with the maximum amplitude.

The second comparator may be configured with the minimum amplitude.

During an actual implementation, in response to determining that the sampled signal being greater than or equal to the maximum amplitude by the first comparator, it is determined that the sampled signal is saturated.

In response to determining that the sampled signal being smaller than or equal to the minimum amplitude by the second comparator, it is determined that the sampled signal is saturated.

Figure 17:
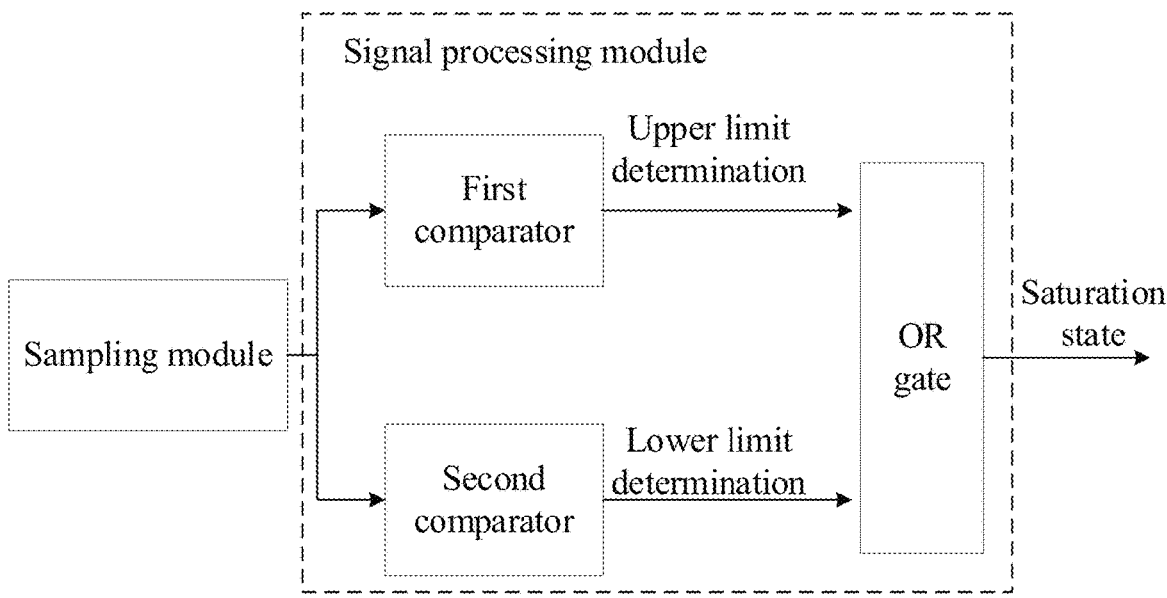
FIG. 17 is a schematic structural diagram of an arc detection system according to an embodiment of the present disclosure.

As shown in FIG. 17, in some embodiments, the signal processing module may further include: a first comparator, a second comparator, and an or gate.

In this embodiment, the or gate is configured to combine determination results of the first comparator and the second comparator into a determination signal to determine the saturation situation of the sampled signal.

Figure 18:
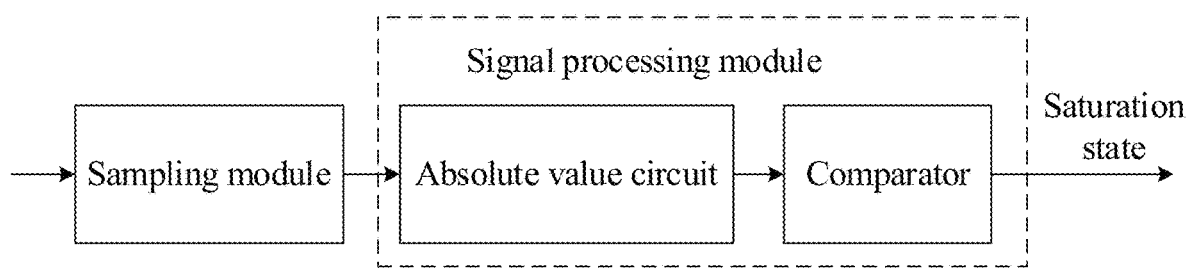
FIG. 18 is a schematic structural diagram of an arc detection system according to an embodiment of the present disclosure.

As shown in FIG. 18, in some embodiments, the signal processing module may further include: an absolute value circuit and a comparator.

In this embodiment, the absolute value circuit is configured to perform absolute value processing on the sampled signal.

During an actual implementation, after the sampled signal is processed by the absolute value circuit, the saturation state of the sampled signal is obtained by inputting the processed data into the comparator.

With the inverter system according to the embodiments of the present disclosure, the sampled signal is processed by a hardware sampling and analysis apparatus through the sampling module and the signal processing module, and the saturation state of the sampled signal is effectively determined. The circuit structure is simple, and the cost is low.

Figure 19:
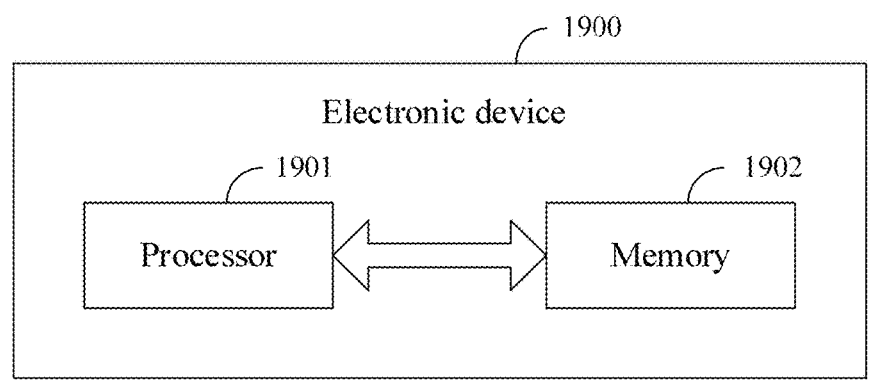
FIG. 19 is a schematic structural diagram of an electronic device according to an embodiment of the present disclosure.

In some embodiments, as shown in FIG. 19, an electronic device 1900 is further provided according to an embodiment of the present disclosure. The electronic device 1900 includes a processor 1901, a memory 1902, and a computer program stored on the memory 1902 and executable on the processor 1901. When executed by the processor 1901, the program implements various processes of the embodiments of the detection method for an inverter system as described above and may achieve the same technical effect. For avoiding repetition, details are omitted here.

It should be noted that the electronic device in the embodiments of the present disclosure includes a mobile electronic device and a non-mobile electronic device as described above.

A non-transitory computer-readable storage medium is further provided according to an embodiment of the present disclosure. The non-transitory computer-readable storage medium has a computer program stored thereon. The computer program, when executed by a processor, implements various processes of the embodiments of the detection method for an inverter system as described above and may achieve the same technical effect. For avoiding repetition, details are omitted here.

The processor is a processor in the electronic device as described in the above embodiments. The readable storage medium includes a computer-readable storage medium, such as a computer read-only memory ROM, a random access memory RAM, and a magnetic disk or an optical disk.

A computer program product is further provided according to an embodiment of the present disclosure, the computer program product includes a computer program. The computer program, when executed by the processor, implements the detection method for an inverter system as described above.

The processor is the processor in the electronic device as described in the above embodiments. The readable storage medium includes a computer-readable storage medium, such as a computer read-only memory ROM, a random access memory RAM, and a magnetic disk or an optical disk.

A chip is further provided according to an embodiment of the present disclosure. The chip includes a processor and a communication interface. The communication interface is coupled to the processor. The processor is configured to run a program or an instruction to implement various processes of the embodiments of the detection method for an inverter system as described above, and achieve the same technical effect. For avoiding repetition, details are omitted here.

It should be understood that the chip mentioned in the embodiments of the present disclosure may also be referred to as a system-level chip, a system chip, a chip system or a system-on-chip, or the like.

It should be noted that, terms "comprise", "include" or any other variations thereof used herein are meant to cover non-exclusive including, such that the process, method, article or device including a series of elements do not only include those elements, but also include other elements that are not explicitly listed, or also include inherent elements of the process, method, article or device. In a case that there are no more restrictions, an element qualified by the statement "comprises a . . . " does not exclude the presence of additional identical elements in the process, method, article or device that includes the said element. In addition, it should be noted that the scope of the methods and devices in the implementations of the present disclosure are not limited to performing the functions in the order shown or discussed, and may also include performing the functions in a substantially simultaneous manner or in a reverse order according to the involved functions. For example, the described methods may be performed in an order different from the described order, and various steps may be added, omitted, or combined. In addition, features described with reference to some examples may be combined in other examples.

From the above description of the implementations, those skilled in the art may clearly understand that the methods of the above embodiments can be implemented by software and a necessary general hardware platform. Of course, the method can also be implemented by hardware, but the former is a preferred implementation in many cases. Based on such understanding, the technical solutions of the present disclosure essentially, or the part contributing to the related art may be embodied in a form of a software product. The computer software product is stored in a storage medium (such as ROM/RAM, a magnetic disk, and an optical disc), and includes several instructions for allowing a terminal (which may be a mobile phone, a computer, a server, or a network device) to execute methods described in the embodiments of the present disclosure.

The embodiments of the present disclosure have been described above with reference to the accompanying drawings, but the present disclosure is not limited to the above-described specific implementations, which are merely schematic and not restrictive, and those skilled in the art can make many forms under the inspiration of the present disclosure without departing from the purpose of the present disclosure and the scope of the claims, all of which fall within the protection of the present disclosure.

In the description of this specification, descriptions with reference to the terms "an embodiment", "some embodiments", "schematic embodiments", "examples", "specific examples", or "some examples", etc. mean that specific features, structure, materials, or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics may be combined in any one or more embodiments or examples in a suitable manner.

Although the embodiments of the present disclosure have been shown and described above, it can be understood by those skilled in the art that various changes, modifications, replacements, and variations can be made to these embodiments without departing from the principles and ideas of the present disclosure. The scope of the present disclosure is defined by the claims as attached and their equivalents.

What is claimed is:

1. A detection method for an inverter system, wherein the inverter system is connected to an arc detection system, and the method comprises:
   obtaining a first actual value of a sampled signal obtained through sampling for the inverter system by the arc detection system, wherein the sampled signal is an input electrical signal of the inverter system, and the first actual value is an actual value corresponding to the sampled signal;
   determining a saturation state of the sampled signal based on at least one of the first actual value, a maximum amplitude corresponding to the sampled signal, and a minimum amplitude corresponding to the sampled signal, wherein the saturation state comprises saturated or unsaturated, the maximum amplitude is an upper amplitude limit for determining whether the sampled signal is saturated, and the minimum amplitude is a lower amplitude limit for determining whether the sampled signal is saturated; and
   performing arc detection based on the saturation state,
   wherein said performing the arc detection based on the saturation state comprises:
      performing, in response to the saturation state being saturated, desaturation processing on the sampled signal by adjusting at least one of an input voltage of the inverter system, an input current of the inverter system, a bus voltage of the inverter system, and a switching frequency of a switching tube in the inverter system;
   wherein said determining the saturation state of the sampled signal based on at least one of the first actual value, the maximum amplitude corresponding to the sampled signal, and the minimum amplitude corresponding to the sampled signal comprises:
      obtaining a target saturation degree of the sampled signal based on at least one of the first actual value, the maximum amplitude, and the minimum amplitude;
      obtaining a target threshold based on the maximum amplitude, the minimum amplitude, and sensitivity information, wherein the sensitivity information is determined based on an association relationship between the target saturation degree and an accuracy degree of an arc detection result of the inverter system;
      determining degrees of influence of different target saturation degrees on the arc detection result of the inverter system through experimental tests, and determining a value of the sensitivity information based on the degrees of influence; and
      determining the saturation state of the sampled signal based on the target saturation degree and the target threshold, or based on the first actual value and the target threshold;
   wherein said obtaining the target saturation degree of the sampled signal based on at least one of the first actual value, the maximum amplitude, and the minimum amplitude comprises:
      obtaining the target saturation degree based on the first actual value, the maximum amplitude, and the minimum amplitude,
         wherein the target saturation degree is determined according to the following equation:

$E = S/(S_{imtup} - S_{imtdn})$,

E being the target saturation degree, S being the first actual value, $S_{imtdn}$ being the minimum amplitude, and $S_{imtup}$ being the maximum amplitude; or
      obtaining a maximum value and a minimum value of first actual values of a plurality of sampled signals within a target period; and obtaining the target saturation degree based on the maximum value and the minimum value,
         wherein the target saturation degree is determined according to the following equation:

$E = S_{max} - S_{min}$,

E being the target saturation degree, $S_{min}$ being the minimum value, and $S_{max}$ being the maximum value; or
      obtaining a first sub-target saturation degree based on the first actual value and the maximum amplitude; obtaining a second sub-target saturation degree based on the first actual value and the minimum amplitude; and obtaining the target saturation degree based on the first sub-target saturation degree and the second sub-target saturation degree,
         wherein the first sub-target saturation degree is determined according to the following equation:

$\Delta E_{up} = (S - S_{imtup})^2$, $\Delta E_{up}$ being the first sub-target saturation degree, S being the first actual value, and $S_{imtup}$ being the maximum amplitude; and
      the second sub-target saturation degree is determined according to the following equation:

$\Delta E_{dn} = (S - S_{imtdn})^2$, $\Delta E_{dn}$ being the second sub-target saturation degree, S being the first actual value, and $S_{imtdn}$ being the minimum amplitude; or
      wherein the first sub-target saturation degree is determined according to the following equation:

$\Delta E_{up} = S_{imtup} - S$, $\Delta E_{up}$ being the first sub-target saturation degree, S being the first actual value, and $S_{imtup}$ being the maximum amplitude; and
      the second sub-target saturation degree is determined according to the following equation:

$\Delta E_{dn} = S - S_{imtdn}$, $\Delta E_{dn}$ being the second sub-target saturation degree, S being the first actual value, and $S_{imtdn}$ being the minimum amplitude.

2. The detection method for an inverter system according to claim 1, wherein said obtaining the target threshold based on the maximum amplitude, the minimum amplitude, and the sensitivity information comprises:

determining a first threshold based on the sensitivity information, the maximum amplitude, and the minimum amplitude, wherein the first threshold is smaller than or equal to a first ratio determined based on the maximum amplitude and a first difference, and the first difference is determined based on the maximum amplitude and the minimum amplitude;

determining a second threshold based on a target value, the sensitivity information, the maximum amplitude, and the minimum amplitude, wherein the second threshold is greater than or equal to a second ratio determined based on the minimum amplitude and the first difference, the second threshold is smaller than the first threshold, and the target value is a constant for determining the second threshold and is 1; and determining the target threshold based on the first threshold and the second threshold, wherein the first threshold is determined according to the following equation:

$$S_{t1}=S_e(S_{imtup}-S_{imtdn}),$$

$S_{t1}$ being the first threshold, $S_{imtdn}$ being the minimum amplitude, $S_{imtup}$ being the maximum amplitude, and $S_e$ being the sensitivity information; and wherein the second threshold is determined according to the following equation:

$$S_{t2}=(1-S_e)(S_{imtup}-S_{imtdn}),$$

$S_{t2}$ being the second threshold, $S_{imtdn}$ being the minimum amplitude, $S_{imtup}$ being the maximum amplitude, and $S_e$ being the sensitivity information.

3. The detection method for an inverter system according to claim 2, wherein said determining the saturation state of the sampled signal based on the target saturation degree and the target threshold, or based on the first actual value and the target threshold comprises:

determining that the sampled signal is saturated in response to the target saturation degree being greater than or equal to the first threshold or the target saturation degree being smaller than or equal to the second threshold; and determining that the sampled signal is unsaturated in response to the target saturation degree being greater than the second threshold and the target saturation degree being smaller than the first threshold.

4. The detection method for an inverter system according to claim 3, wherein said determining the saturation state of the sampled signal based on the target saturation degree and the target threshold, or based on the first actual value and the target threshold comprises:

determining that the sampled signal is saturated in response to the first actual value being greater than or equal to the first threshold or the first actual value being smaller than or equal to the second threshold; and determining that the sampled signal is unsaturated in response to the first actual value being greater than the second threshold and the first actual value being smaller than the first threshold.

5. The detection method for an inverter system according to claim 1, wherein said determining the saturation state of the sampled signal based on the target saturation degree and the target threshold, or based on the first actual value and the target threshold comprises:

determining that the sampled signal is saturated in response to the target saturation degree being greater than or equal to the target threshold; and determining that the sampled signal is unsaturated in response to the target saturation degree being smaller than the target threshold.

6. The detection method for an inverter system according to claim 1, wherein said determining the saturation state of the sampled signal based on the target saturation degree and the target threshold, or based on the first actual value and the target threshold comprises:

determining that the sampled signal is saturated in response to the first sub-target saturation degree being smaller than or equal to the target threshold or the second sub-target saturation degree being smaller than or equal to the target threshold; and determining that the sampled signal is unsaturated in response to the first sub-target saturation degree being greater than the target threshold and the second sub-target saturation degree being greater than the target threshold.

7. The detection method for an inverter system according to claim 1, wherein the sampled signal further comprises an inductive electrical signal of the inverter system; and said determining the saturation state of the sampled signal based on the at least one of the first actual value, the maximum amplitude corresponding to the sampled signal, and the minimum amplitude corresponding to the sampled signal comprises:

determining a saturation state of the inductive electrical signal based on the first actual value of the inductive electrical signal, the input voltage of the inverter system, and the switching frequency of the switching tube in the inverter system, wherein said determining the saturation state of the inductive electrical signal based on the first actual value of the inductive electrical signal, the input voltage of the inverter system, and the switching frequency of the switching tube in the inverter system comprises:

obtaining a target current ripple based on the first actual value of the inductive electrical signal, or based on the first actual value of the inductive electrical signal, the input voltage of the inverter system, and the switching frequency of the switching tube in the inverter system;

obtaining a target ripple threshold based on the inductive electrical signal and inductive current sensitivity information, wherein the inductive current sensitivity information is determined based on a ratio of a maximum value corresponding to a current ripple range of the inductive electrical signal to the first actual value of the inductive electrical signal; and determining the saturation state of the inductive electrical signal based on the target current ripple and the target ripple threshold, wherein said determining the saturation state of the inductive electrical signal based on the target current ripple and the target ripple threshold comprises:

determining that the inductive electrical signal is saturated in response to the target current ripple being greater than or equal to the target ripple threshold; and determining that the inductive electrical signal is unsaturated in response to the target current ripple being smaller than the target ripple threshold.

8. The detection method for an inverter system according to claim 7, wherein said obtaining the target current ripple based on the first actual value of the inductive electrical signal, or based on the first actual value of the inductive electrical signal, the input voltage of the inverter system, and the switching frequency of the switching tube in the inverter system comprises:
- obtaining a maximum inductive current value and a minimum inductive current value of first actual values of a plurality of inductive electrical signals within a target period; and
- obtaining the target current ripple based on the maximum inductive current value and the minimum inductive current value,
- wherein the target current ripple is determined according to the following equation:

$$\Delta I_L = I_{Lmax} - I_{Lmin},$$

$\Delta I_L$ being the target current ripple, $I_{Lmax}$ being the maximum inductive current value, and $I_{Lmin}$ being the minimum inductive current value.

9. The detection method for an inverter system according to claim 7, wherein said obtaining the target current ripple based on the first actual value of the inductive electrical signal, or based on the first actual value of the inductive electrical signal, the input voltage of the inverter system, and the switching frequency of the switching tube in the inverter system comprises:
- obtaining the target current ripple based on the first actual value of the inductive electrical signal, the input voltage of the inverter system, and the switching frequency of the switching tube in the inverter system,
- wherein the target current ripple is determined according to the following equation:

$$\Delta I_L = V/fL,$$

$\Delta I_L$ being the target current ripple, L being the first actual value of the inductive electrical signal, V being the input voltage of the inverter system, and f being the switching frequency of the switching tube.

10. The detection method for an inverter system according to claim 1, wherein said determining the saturation state of the sampled signal based on at least one of the first actual value, the maximum amplitude corresponding to the sampled signal, and the minimum amplitude corresponding to the sampled signal comprises:
- performing transformation on the first actual value to obtain target transformation data, wherein the transformation comprises fast Fourier transform and wavelet transform;
- performing algorithm analysis on the target transformation data to obtain an algorithm analysis result, wherein an algorithm used for the algorithm analysis is an algorithm capable of obtaining the saturation state of the sampled signal, and the algorithm analysis result is a result that is capable of characterizing the saturation state of the sampled signal and is obtained by performing the algorithm analysis on the target transformation data; and
- determining the saturation state of the sampled signal based on the algorithm analysis result.

11. The detection method for an inverter system according to claim 10, wherein said performing the algorithm analysis on the target transformation data to obtain the algorithm analysis result comprises:
- grouping the target transformation data to obtain at least one target data group;
- calculating statistical information corresponding to each of the at least one target data group, wherein the statistical information is a mean value corresponding to the target data group and maximum and minimum values corresponding to the target data group;
- determining weight information of each of the at least one target data group based on the statistical information; and
- performing the algorithm analysis based on the weight information and each of the at least one target data group to obtain the algorithm analysis result.

12. The detection method for an inverter system according to claim 10, wherein said determining the saturation state of the sampled signal based on the algorithm analysis result comprises:
- determining a spectral characteristic based on the algorithm analysis result, wherein the spectral characteristic comprises spectral diffusion and no spectral diffusion; and
- determining the saturation state of the sampled signal based on the spectral characteristic.

13. The detection method for an inverter system according to claim 12, wherein said determining the saturation state of the sampled signal based on the spectral characteristic comprises:
- determining an arc state based on the spectral characteristic, wherein the arc state comprises arc generation or no arc generation; and
- determining the saturation state of the sampled signal based on the arc state.

14. The detection method for an inverter system according to claim 1, wherein said performing the arc detection based on the saturation state comprises:
- performing the desaturation processing on the sampled signal in response to the saturation state being saturated to obtain an unsaturated sampled signal; and
- performing the arc detection based on the unsaturated sampled signal.

15. The detection method for an inverter system according to claim 14, wherein said performing the desaturation processing on the sampled signal to obtain the unsaturated sampled signal comprises:
- performing the desaturation processing on the sampled signal by adjusting at least one of the input voltage of the inverter system, the input current of the inverter system, the bus voltage of the inverter system, and the switching frequency of the switching tube in the inverter system to obtain the unsaturated sampled signal.

16. The detection method for an inverter system according to claim 15, wherein said performing the desaturation processing on the sampled signal by adjusting the bus voltage of the inverter system to obtain the unsaturated sampled signal comprises:
- adjusting at least one of a bus voltage corresponding to the inverter system, a bus voltage corresponding to a battery pack electrically connected to an inverter, and a bus voltage corresponding to a charging pile electrically connected to the inverter to perform the desaturation processing on the sampled signal to obtain the unsaturated sampled signal.

17. A detection apparatus for an inverter system, wherein the inverter system is connected to an arc detection system; and the apparatus comprises:
- a first processing module, configured to obtain a first actual value of a sampled signal obtained through sampling for the inverter system by the arc detection system, wherein the sampled signal is an input electrical signal of the inverter system, and the first actual value is an actual value corresponding to the sampled signal;

a second processing module, configured to determine a saturation state of the sampled signal based on at least one of the first actual value, a maximum amplitude corresponding to the sampled signal, and a minimum amplitude corresponding to the sampled signal, wherein the saturation state comprises saturated or unsaturated, the maximum amplitude is an upper amplitude limit for determining whether the sampled signal is saturated, and the minimum amplitude is a lower amplitude limit for determining whether the sampled signal is saturated; and a third processing module, configured to perform arc detection based on the saturation state, wherein the third processing module is further configured to:
perform, in response to the saturation state being saturated, desaturation processing on the sampled signal by adjusting at least one of an input voltage of the inverter system, an input current of the inverter system, a bus voltage of the inverter system, and a switching frequency of a switching tube in the inverter system;

wherein the second processing module is further configured to:
obtain a target saturation degree of the sampled signal based on at least one of the first actual value, the maximum amplitude, and the minimum amplitude;
obtain a target threshold based on the maximum amplitude, the minimum amplitude, and sensitivity information, wherein the sensitivity information is determined based on an association relationship between the target saturation degree and an accuracy degree of an arc detection result of the inverter system;
determine degrees of influence of different target saturation degrees on the arc detection result of the inverter system through experimental tests, and determine a value of the sensitivity information based on the degrees of influence; and
determine the saturation state of the sampled signal based on the target saturation degree and the target threshold, or based on the first actual value and the target threshold;

wherein the second processing module is further configured to:
obtain the target saturation degree based on the first actual value, the maximum amplitude, and the minimum amplitude,
wherein the target saturation degree is determined according to the following equation:

$$E = S/(S_{imtup} - S_{imtdn}),$$

E being the target saturation degree, S being the first actual value, $S_{imtdn}$ being the minimum amplitude, and $S_{imtup}$ being the maximum amplitude; or obtain a maximum value and a minimum value of first actual values of a plurality of sampled signals within a target period; and obtain the target saturation degree based on the maximum value and the minimum value,
wherein the target saturation degree is determined according to the following equation:

$$E = S_{max} - S_{min},$$

E being the target saturation degree, $S_{min}$ being the minimum value, and $S_{max}$ being the maximum value; or obtain a first sub-target saturation degree based on the first actual value and the maximum amplitude; obtain a second sub-target saturation degree based on the first actual value and the minimum amplitude; and obtain the target saturation degree based on the first sub-target saturation degree and the second sub-target saturation degree,
wherein the first sub-target saturation degree is determined according to the following equation:

$$\Delta E_{up} = (S - S_{imtup})^2,$$

$\Delta E_{up}$ being the first sub-target saturation degree, S being the first actual value, and $S_{imtup}$ being the maximum amplitude; and
the second sub-target saturation degree is determined according to the following equation:

$$\Delta E_{dn} = (S - S_{imtdn})^2,$$

$\Delta E_{dn}$ being the second sub-target saturation degree, S being the first actual value, and $S_{imtdn}$ being the minimum amplitude; or wherein the first sub-target saturation degree is determined according to the following equation:

$$\Delta E_{up} = S_{imtup} - S,$$

$\Delta E_{up}$ being the first sub-target saturation degree, S being the first actual value, and $S_{imtup}$ being the maximum amplitude; and
the second sub-target saturation degree is determined according to the following equation:

$$\Delta E_{dn} = S - S_{imtdn},$$

$\Delta E_{dn}$ being the second sub-target saturation degree, S being the first actual value, and $S_{imtdn}$ being the minimum amplitude.

18. The detection device according to claim 17, wherein the second processing module is further configured to:
determine a first threshold based on the sensitivity information, the maximum amplitude, and the minimum amplitude, wherein the first threshold is smaller than or equal to a first ratio determined based on the maximum amplitude and a first difference, and the first difference is determined based on the maximum amplitude and the minimum amplitude;
determine a second threshold based on a target value, the sensitivity information, the maximum amplitude, and the minimum amplitude, wherein the second threshold is greater than or equal to a second ratio determined based on the minimum amplitude and the first difference, the second threshold is smaller than the first threshold, and the target value is a constant for determining the second threshold and is 1; and
determine the target threshold based on the first threshold and the second threshold,
wherein the first threshold is determined according to the following equation:

$$S_{t1} = S_e(S_{imtup} - S_{imtdn}),$$

$S_{t1}$ being the first threshold, $S_{imtdn}$ being the minimum amplitude, $S_{imtup}$ being the maximum amplitude, and $S_e$ being the sensitivity information; and
wherein the second threshold is determined according to the following equation:

$$S_{t2} = (1 - S_e)(S_{imtup} - S_{imtdn}),$$

$S_{t2}$ being the second threshold, $S_{imtdn}$ being the minimum amplitude, $S_{imtup}$ being the maximum amplitude, and $S_e$ being the sensitivity information.

19. A non-transitory computer-readable storage medium, having a computer program stored thereon, wherein the computer program, when executed by a processor, implements the detection method for an inverter system according to claim 1.

* * * * *

UNITED STATES PATENT AND TRADEMARK OFFICE
CERTIFICATE OF CORRECTION

PATENT NO. : 12,411,186 B1
APPLICATION NO. : 19/237049
DATED : September 9, 2025
INVENTOR(S) : Zhanxiang Yin et al.

It is certified that error appears in the above-identified patent and that said Letters Patent is hereby corrected as shown below:

In the Specification

Column 15, Line 14 '$S_{t1}=f_2(S_{imtdn},S_{imtup},S_e)$', should read --$S_{t1}=f_2(S_{lmtdn},S_{lmtup},S_e)$--.

Column 15, Line 15 '$S_{imtdn}$', should read --$S_{lmtdn}$--.

Column 15, Line 16 '$S_{imtup}$', should read --$S_{lmtup}$--.

Column 15, Line 25 '$S_{t1}=S_e(S_{imtup}-S_{imtdn})$', should read --$S_{t1}=S_e(S_{lmtup}-S_{lmtdn})$--.

Column 15, Line 26 '$S_{imtdn}$', should read --$S_{lmtdn}$--.

Column 15, Line 27 '$S_{imtup}$', should read --$S_{lmtup}$--.

Column 15, Line 31 '$S_{t2}=f_3(S_{imtdn},S_{imtup},S_e)$', should read --$S_{t2}=f_3(S_{lmtdn},S_{lmtup},S_e)$--.

Column 15, Line 32 '$S_{imtdn}$', should read --$S_{lmtdn}$--.

Column 15, Line 33 '$S_{imtup}$', should read --$S_{lmtup}$--.

Column 15, Line 39 '$S_{t2}=(1-S_e)(S_{imtup}-S_{imtdn})$', should read --$S_{t2}=(1-S_e)(S_{lmtup}-S_{lmtdn})$--.

Column 15, Line 40 '$S_{imtdn}$', should read --$S_{lmtdn}$--.

Column 15, Line 41 '$S_{imtup}$', should read --$S_{lmtup}$--.

Column 15, Line 46 '$A=S_{imtup}-S_{imtdn}$', should read --$A=S_{lmtup}-S_{lmtdn}$--.

Signed and Sealed this
Twenty-seventh Day of January, 2026

John A. Squires
*Director of the United States Patent and Trademark Office*

CERTIFICATE OF CORRECTION (continued)
U.S. Pat. No. 12,411,186 B1

Column 15, Line 47 '$S_{imtdn}$', should read --$S_{lmtdn}$--.

Column 15, Line 48 '$S_{imtup}$', should read --$S_{lmtup}$--.

Column 15, Line 52 '$B=S_{imtup}/(S_{imtup}-S_{imtdn})$', should read --$B=S_{lmtup}/(S_{lmtup}-S_{lmtdn})$--.

Column 15, Line 53 '$S_{imtdn}$', should read --$S_{lmtdn}$--.

Column 15, Line 54 '$S_{imtup}$', should read --$S_{lmtup}$--.

Column 15, Line 58 '$C=S_{imtdn}/(S_{imtup}-S_{imtdn})$', should read --$C=S_{lmtdn}/(S_{lmtup}-S_{lmtdn})$--.

Column 15, Line 59 '$S_{imtdn}$', should read --$S_{lmtdn}$--.

Column 15, Line 60 '$S_{imtup}$', should read --$S_{lmtup}$--.

Column 15, Line 65 '$S_{imtdn}/(S_{imtup}-S_{imtdn}) \leq S_{t2} \leq S_{t1} \leq S_{imtup}/(S_{imtup}-S_{imtdn})$', should read --$S_{lmtdn}/(S_{lmtup}-S_{lmtdn}) \leq S_{t2} \leq S_{t1} \leq S_{lmtup}/(S_{lmtup}-S_{lmtdn})$--.

Column 16, Line 33 '$E=f_1(S,S_{imtdn},S_{imtup})$', should read --$E=f_1(S,S_{lmtdn},S_{lmtup})$--.

Column 16, Line 35 '$S_{imtdn}$', should read --$S_{lmtdn}$--.

Column 16, Line 35 '$S_{imtup}$', should read --$S_{lmtup}$--.

Column 16, Line 42 '$E=S/(S_{imtup}-S_{imtdn})$', should read --$E=S/(S_{lmtup}-S_{lmtdn})$--.

Column 16, Line 44 '$S_{imtdn}$', should read --$S_{lmtdn}$--.

Column 16, Line 44 '$S_{imtup}$', should read --$S_{lmtup}$--.

Column 19, Line 27 '$S_t=f_6(S_{imtdn},S_{imtup},S_e)$', should read --$S_t=f_6(S_{lmtdn},S_{lmtup},S_e)$--.

Column 19, Line 28 '$S_{imtdn}$', should read --$S_{lmtdn}$--.

Column 19, Line 29 '$S_{imtup}$', should read --$S_{lmtup}$--.

Column 19, Line 35 '$S_t=S_e(S_{imtdn}+S_{imtup})$', should read --$S_t=S_e(S_{lmtdn}+S_{lmtup})$--.

Column 19, Line 36 '$S_{imtdn}$', should read --$S_{lmtdn}$--.

Column 19, Line 37 '$S_{imtup}$', should read --$S_{lmtup}$--.

CERTIFICATE OF CORRECTION (continued)
U.S. Pat. No. 12,411,186 B1

Column 20, Line 16 '$\Delta E_{up}=f_8(S,S_{imtup})$', should read --$\Delta E_{up}=f_8(S,S_{lmtup})$--.

Column 20, Line 18 '$S_{imtup}$', should read --$S_{lmtup}$--.

Column 20, Line 23 '$\Delta E_{dn}=f_9(S,S_{imtdn})$', should read --$\Delta E_{dn}=f_9(S,S_{lmtdn})$--.

Column 20, Line 25 '$S_{imtdn}$', should read --$S_{lmtdn}$--.

Column 20, Line 30 '$\Delta E_{up}=(S-S_{imtup})^2$', should read --$\Delta E_{up}=(S-S_{lmtup})^2$--.

Column 20, Line 32 '$S_{imtup}$', should read --$S_{lmtup}$--.

Column 20, Line 36 '$\Delta E_{dn}=(S-S_{imtdn})^2$', should read --$\Delta E_{dn}=(S-S_{lmtdn})^2$--.

Column 20, Line 38 '$S_{imtdn}$', should read --$S_{lmtdn}$--.

Column 20, Line 49 '$\Delta E_{up}=S_{imtup}-S$', should read --$\Delta E_{up}=S_{lmtup}-S$--.

Column 20, Line 51 '$S_{imtup}$', should read --$S_{lmtup}$--.

Column 20, Line 55 '$\Delta E_{dn}=S-S_{imtdn}$', should read --$\Delta E_{dn}=S-S_{lmtdn}$--.

Column 20, Line 57 '$S_{imtdn}$', should read --$S_{lmtdn}$--.

Column 20, Line 58 '$S \geq S_{imtup}$', should read --$S \geq S_{lmtup}$--.

Column 20, Line 60 '$S \leq S_{imtup}$', should read --$S \leq S_{lmtup}$--.

Column 21, Line 18 '$S_i=f_{10}(S_{imtdn},S_{imtup},S_e)$', should read --$S_i=f_{10}(S_{lmtdn},S_{lmtup},S_e)$--.

Column 21, Line 19 '$S_{imtdn}$', should read --$S_{lmtdn}$--.

Column 21, Line 20 '$S_{imtup}$', should read --$S_{lmtup}$--.

Column 21, Line 25 '$S_i=(1-S_e)(S_{imtdn}+S_{imtup})$', should read --$S_i=(1-S_e)(S_{lmtdn}+S_{lmtup})$--.

Column 21, Line 26 '$S_{imtdn}$', should read --$S_{lmtdn}$--.

Column 21, Line 27 '$S_{imtup}$', should read --$S_{lmtup}$--.

Column 36, Line 15 '$E=S/(S_{imtup}-S_{imtdn})$', should read --$E=S/(S_{lmtup}-S_{lmtdn})$--.

CERTIFICATE OF CORRECTION (continued)
U.S. Pat. No. 12,411,186 B1

Column 36, Line 17 '$S_{imtdn}$', should read --$S_{lmtdn}$--.

Column 36, Line 18 '$S_{imtup}$', should read --$S_{lmtup}$--.

Column 36, Line 41 '$\Delta E_{up}=(S-S_{imtup})^2$', should read --$\Delta E_{up}=(S-S_{lmtup})^2$--.

Column 36, Line 43 '$S_{imtup}$', should read --$S_{lmtup}$--.

Column 36, Line 48 '$\Delta E_{dn}=S-S_{imtdn})^2$', should read --$\Delta E_{dn}=S-S_{lmtdn})^2$--.

Column 36, Line 50 '$S_{imtdn}$', should read --$S_{lmtdn}$--.

Column 36, Line 55 '$\Delta E_{up}=S_{imtup}-S$', should read --$\Delta E_{up}=S_{lmtup}-S$--.

Column 36, Line 57 '$S_{imtup}$', should read --$S_{lmtup}$--.

Column 36, Line 62 '$\Delta E_{dn}=S-S_{imtdn}$', should read --$\Delta E_{dn}=S-S_{lmtdn}$--.

Column 36, Line 64 '$S_{imtdn}$', should read --$S_{lmtdn}$--.

Column 37, Line 25 '$S_{t1}=S_e(S_{imtup}-S_{imtdn})$', should read --$S_{t1}=S_e(S_{lmtup}-S_{lmtdn})$--.

Column 37, Line 26 '$S_{imtdn}$', should read --$S_{lmtdn}$--.

Column 37, Line 27 '$S_{imtup}$', should read --$S_{lmtup}$--.

Column 37, Line 32 '$S_{t2}=(1-S_e)(S_{imtup}-S_{imtdn})$', should read --$S_{t2}=(1-S_e)(S_{lmtup}-S_{lmtdn})$--.

Column 37, Line 33 '$S_{imtdn}$', should read --$S_{lmtdn}$--.

Column 37, Line 34 '$S_{imtup}$', should read --$S_{lmtup}$--.

Column 41, Line 55 '$E=S/(S_{imtup}-S_{imtdn})$', should read --$E=S/(S_{lmtup}-S_{lmtdn})$--.

Column 41, Line 57 '$S_{imtdn}$', should read --$S_{lmtdn}$--.

Column 41, Line 58 '$S_{imtup}$', should read --$S_{lmtup}$--.

Column 42, Line 14 '$\Delta E_{up}=(S-S_{imtup})^2$', should read --$\Delta E_{up}=(S-S_{lmtup})^2$--.

Column 42, Line 16 '$S_{imtup}$', should read --$S_{lmtup}$--.

Column 42, Line 21 '$\Delta E_{dn}=(S-S_{imtdn})^2$', should read --$\Delta E_{dn}=(S-S_{lmtdn})^2$--.

Column 42, Line 23 '$S_{imtdn}$', should read --$S_{lmtdn}$--.

Column 42, Line 28 '$\Delta E_{up}=S_{imtup}-S$', should read --$\Delta E_{up}=S_{lmtup}-S$--.

Column 42, Line 30 '$S_{imtup}$', should read --$S_{lmtup}$--.

Column 42, Line 35 '$\Delta E_{dn}=S-S_{imtdn}$', should read --$\Delta E_{dn}=S-S_{lmtdn}$--.

Column 42, Line 37 '$S_{imtdn}$', should read --$S_{lmtdn}$--.

Column 42, Line 60 '$S_{t1}=S_e(S_{imtup}-S_{imtdn})$', should read --$S_{t1}=S_e(S_{lmtup}-S_{lmtdn})$--.

Column 42, Line 61 '$S_{imtdn}$', should read --$S_{lmtdn}$--.

Column 42, Line 62 '$S_{imtup}$', should read --$S_{lmtup}$--.

Column 42, Line 67 '$S_{t2}=(1-S_e)(S_{imtup}-S_{imtdn})$', should read --$S_{t2}=(1-S_e)(S_{lmtup}-S_{lmtdn})$--.

Column 43, Line 1 '$S_{imtdn}$', should read --$S_{lmtdn}$--.

Column 43, Line 2 '$S_{imtup}$', should read --$S_{lmtup}$--.